United States Patent
Melzner et al.

(10) Patent No.: US 8,299,716 B2
(45) Date of Patent: Oct. 30, 2012

(54) LIGHTING DEVICE COMPRISING A PLURALITY OF CONTROLLABLE LIGHT-EMITTING DIODES

(75) Inventors: Erwin Melzner, Frasdorf (DE); Regine Kraemer, Munich (DE); Michael Haubmann, Vienna (AT); Johann Hochreiter, Neulengbach (AT)

(73) Assignee: Arnold & Richter Cine Technik GmbH & Co. Betriebs KG, Munich (DE)

( * ) Notice: Subject to any disclaimer, the term of this patent is extended or adjusted under 35 U.S.C. 154(b) by 418 days.

(21) Appl. No.: 12/676,879

(22) PCT Filed: Aug. 20, 2008

(86) PCT No.: PCT/EP2008/060892
§ 371 (c)(1),
(2), (4) Date: Mar. 5, 2010

(87) PCT Pub. No.: WO2009/033922
PCT Pub. Date: Mar. 19, 2009

(65) Prior Publication Data
US 2010/0219758 A1 Sep. 2, 2010

(30) Foreign Application Priority Data
Sep. 7, 2007 (DE) .......... 10 2007 044 567

(51) Int. Cl.
*H05B 37/00* (2006.01)
*H05B 37/02* (2006.01)
(52) U.S. Cl. ......... 315/113; 315/312; 315/309; 315/291
(58) Field of Classification Search .......... 315/113, 315/118, 291, 294, 297, 307–309, 312
See application file for complete search history.

(56) References Cited

U.S. PATENT DOCUMENTS
D264,460 S  5/1982  Möller
(Continued)

FOREIGN PATENT DOCUMENTS
DE  203 09 033 U1  1/2004
(Continued)

OTHER PUBLICATIONS
International Search Report, dated May 6, 2007, corresponding to PCT/EP2008/060892.
(Continued)

*Primary Examiner* — Don Le
(74) *Attorney, Agent, or Firm* — Christie, Parker & Hale, LLP

(57) ABSTRACT

A lighting device comprising a plurality of lighting modules which include a module carrier on which a light source with a plurality of controllable light-emitting diodes emitting light of different wavelengths and arranged on a board, a temperature sensor and a module electronic are arranged. Said module electronic contains a digital circuit with a microcontroller for the local and autonomous signal processing, which actuates the LEDs in dependence on the temperature such that the brightness, color and chrominance of the light mixture composed of the LEDs emitting light of different wavelengths is constant. Said lighting modules being connected with other lighting modules or an external controller via a digital interface for transmitting the board temperature of the respective lighting module detected by means of the temperature sensor. A central master module or the external controller actuates the lighting modules such that a uniform brightness is obtained over the radiating surface.

21 Claims, 18 Drawing Sheets

U.S. PATENT DOCUMENTS

| | | | |
|---|---|---|---|
| D297,527 S | 9/1988 | Iacovelli | |
| 4,879,437 A | 11/1989 | Dard et al. | |
| D356,567 S | 3/1995 | Jones | |
| D368,429 S | 4/1996 | Serio, Jr. | |
| D423,449 S | 4/2000 | Naskali | |
| D477,286 S | 7/2003 | Krajci et al. | |
| D489,337 S | 5/2004 | Murray | |
| D506,065 S | 6/2005 | Sugino et al. | |
| D516,503 S | 3/2006 | Takeshita et al. | |
| D533,846 S | 12/2006 | Burton | |
| D548,684 S | 8/2007 | Eto et al. | |
| D550,613 S | 9/2007 | Hamasaki | |
| 7,274,302 B2 | 9/2007 | Stevenson et al. | |
| D568,240 S | 5/2008 | Haydvogel | |
| D572,192 S | 7/2008 | Zhu | |
| D584,224 S | 1/2009 | Mori et al. | |
| D602,857 S | 10/2009 | Melzner et al. | |
| D602,877 S | 10/2009 | Melzner et al. | |
| D603,345 S | 11/2009 | Melzner et al. | |
| D603,350 S | 11/2009 | Melzner et al. | |
| 7,621,667 B2 | 11/2009 | Behr et al. | |
| 2006/0057461 A1 | 3/2006 | Hamada et al. | |
| 2007/0258240 A1* | 11/2007 | Ducharme et al. | 362/231 |
| 2008/0205055 A1 | 8/2008 | Schug et al. | |
| 2008/0297054 A1 | 12/2008 | Speier | |
| 2009/0046453 A1 | 2/2009 | Kramer | |
| 2009/0206758 A1 | 8/2009 | Kobilke | |
| 2009/0273930 A1 | 11/2009 | Kraus | |
| 2011/0182065 A1* | 7/2011 | Negley et al. | 362/231 |
| 2011/0211351 A1* | 9/2011 | Van De Ven et al. | 362/249.02 |
| 2012/0104953 A1* | 5/2012 | Chobot | 315/153 |
| 2012/0139446 A1* | 6/2012 | Koren et al. | 315/297 |

FOREIGN PATENT DOCUMENTS

| | | |
|---|---|---|
| DE | 20 2004 016 637 U1 | 2/2005 |
| DE | 4 07 04 520 | 12/2007 |
| DE | 40 2008 001 754 | 5/2008 |
| DE | 10 2007 044 566 A1 | 3/2009 |
| EP | 0 921 568 A2 | 6/1999 |
| FR | 2 830 314 A1 | 4/2003 |
| WO | WO 2006/066530 A1 | 6/2006 |
| WO | WO 2006/082537 A1 | 8/2006 |
| WO | WO 2006/105649 A1 | 10/2006 |
| WO | WO 2006/119750 A2 | 11/2006 |
| WO | WO 2007/065390 A1 | 6/2007 |
| WO | WO 2007/071397 A1 | 6/2007 |

OTHER PUBLICATIONS

U.S. Appl. No. 29/325,719, filed Oct. 3, 2008, Erwin Melzner et al., Entitled Spotlight System.

English translation of International Preliminary Report on Patentability dated Jun. 10, 2010 for corresponding PCT Application No. PCT/EP2008/060892.

* cited by examiner

FIG 2
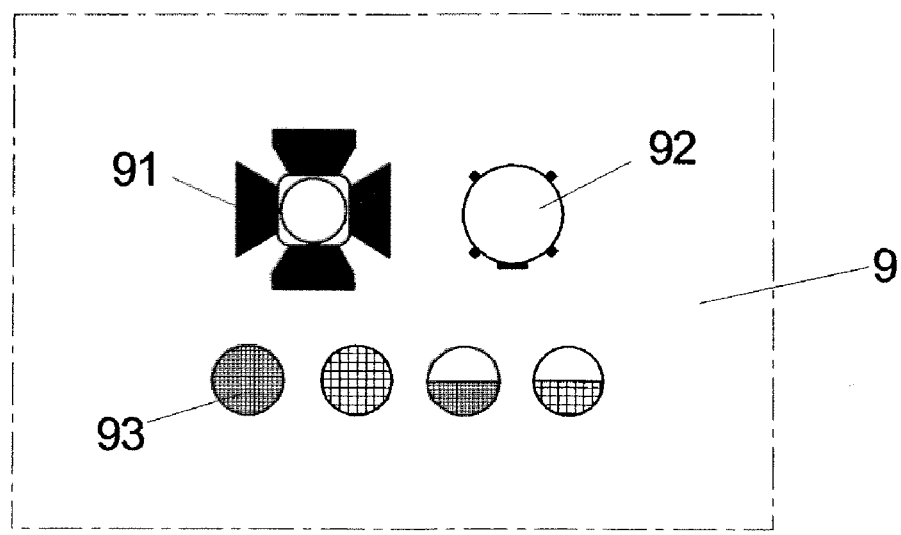
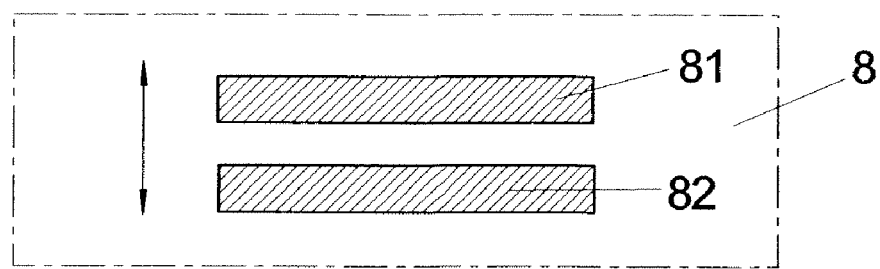
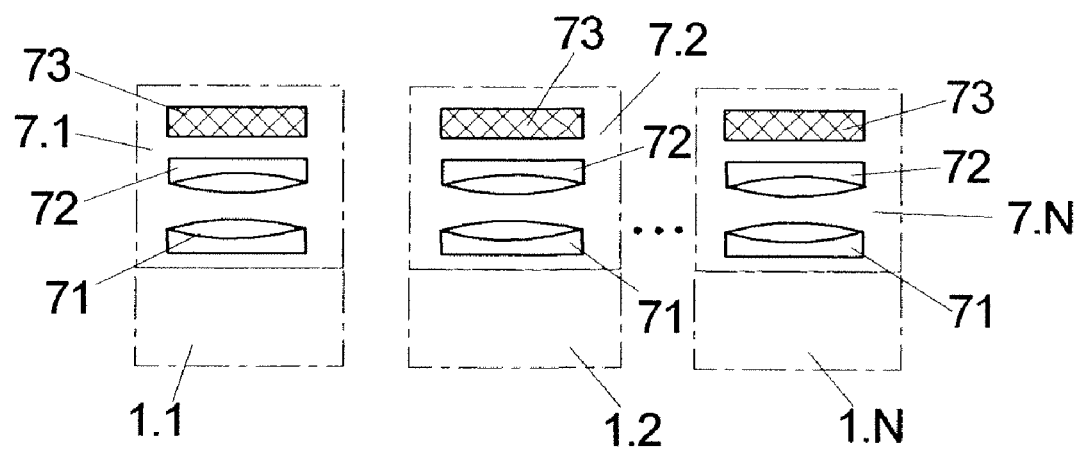

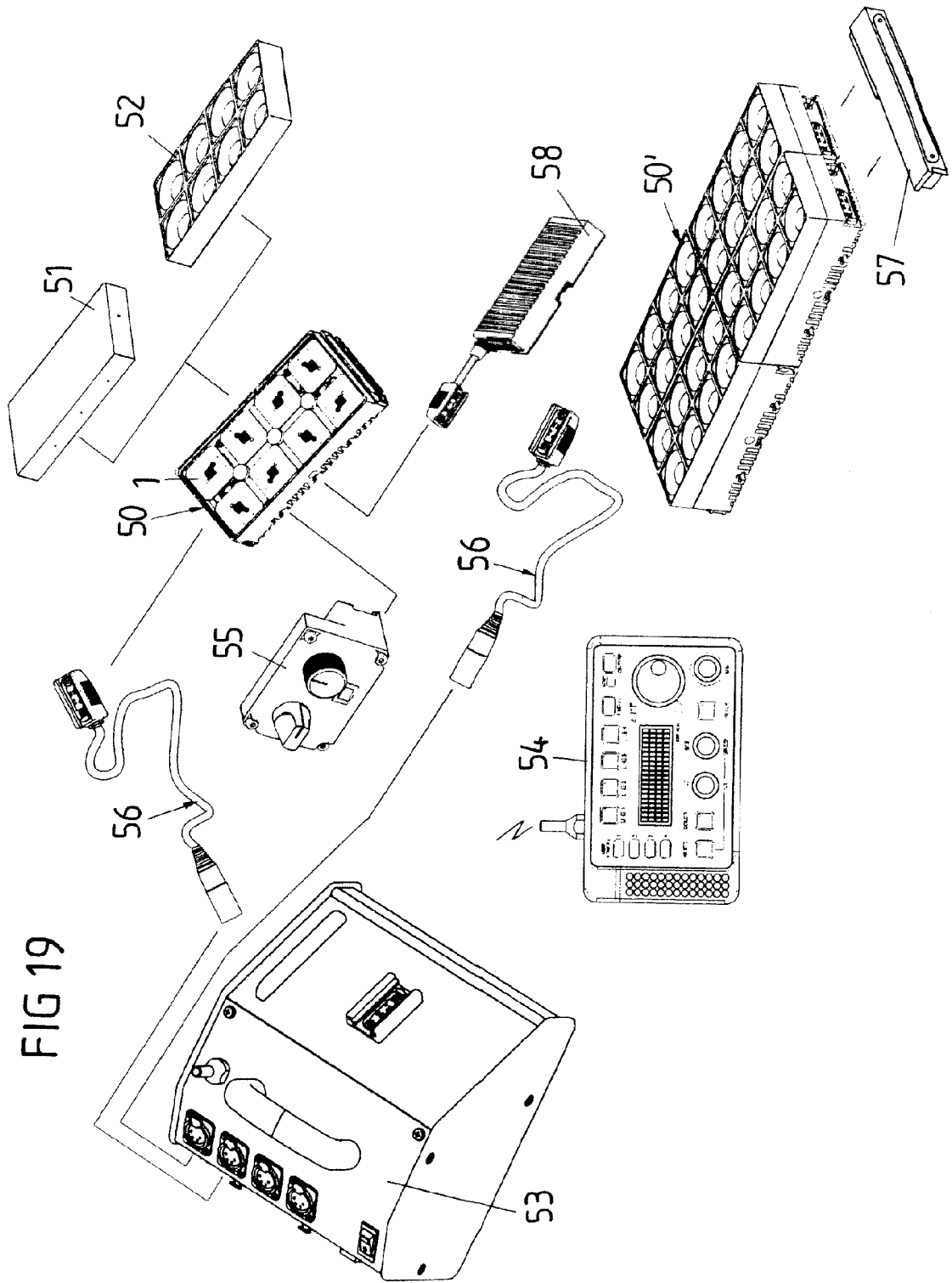

LIGHTING DEVICE COMPRISING A PLURALITY OF CONTROLLABLE LIGHT-EMITTING DIODES

CROSS-REFERENCE TO A RELATED APPLICATION

This application is a National Phase Patent Application of International Patent Application Number PCT/EP2008/060892, filed on Aug. 20, 2008, which claims priority of German Patent Application Number 10 2007 044 567.0, filed on Sep. 7, 2007.

BACKGROUND

This invention relates to a lighting device.

Illuminants referred to as light diodes, light-emitting diodes or LEDs offer the possibility of producing flat light-emitting lampheads homogeneous over their surface, which in larger constructions as surface luminaires named "Softlight", "Filllight" or lightener can be used in all fields of professional lighting, as portrait lamps in the direct vicinity of a motion picture or video camera, in confined spaces, such as vehicles and staircases, and for the erection of light walls for event or stage lighting.

From DE 20 2004 016 637 U1 a lighting device with a carrier is known, on which connection points for contacting electronic components and conductors are provided, which interconnect the connection points with each other and connect them with a power source. On the carrier, a light-emitting diode, a control electronic and switching devices for switching the light-emitting diode are arranged. The light-emitting diode in particular emits white light and is mechanically mounted on the carrier and in electrical contact with connection points. The control electronic contains a light sensor for measuring the ambient brightness and for regulating the brightness of the light-emitting diode, and includes a pulse width modulation circuit for controlling the intensity with which the light-emitting diode emits light.

When combining a plurality of such lighting devices, it is required to consider the specified radiation characteristic and actuation of each individual lighting device when determining the total characteristic of the expanded lighting device. In addition, due to the integration of a plurality of control electronics arranged on the carrier the known lighting device has a considerable space requirement, which in the case of a combination of a plurality of lighting devices for example to a lamphead would lead to considerable dimensions not acceptable in practice and the number of light-emitting elements would be too small for a lamphead because of the great mutual distance of the individual light-emitting diodes arranged on the carrier together with the control electronics and switching means. Therefore, an application of the known lighting device is limited to interior lightings of vehicles, light spots, reading lamps or the like.

Illumination lampheads with light-emitting diodes or LEDs, which are used for example as a camera attachment light for film and video cameras, either have the color temperature "daylight white" or "warm white", wherein a stepless or exact activation or switchover from a warm white to a daylight white color temperature is not possible and in both variants the color rendering in film and video recordings is unsatisfactory.

When using LEDs of different colors with a non-continuous spectral distribution in an LED lamphead for the illumination of film or video recordings, the LEDs reach the required values for color temperature and color rendering, but when used for film recordings nevertheless have a considerable color cast as compared to incandescent lamps or HMI lamps or daylight. This is referred to as insufficient suitability for mixed light.

From EP 0 921 568 A2 a lighting device is known, in which a plurality of LED chips emitting monochromatic light of different colors are inserted into depressions of a three-dimensional carrier of rectangular cross-section, are electrically connected with conductors and sealed with a transparent plastic material. In emission direction of the LED chips, a diffuser plate of transparent plastic material, which consists of microlenses for light control, is connected with the three-dimensional carrier. The matrix-like combination of a plurality of modules with LEDs emitting monochromatic red, green, blue and yellow light with different color mixture and light scatter, which are arranged in the depressions of the carrier, leads to a lighting device with adjustable light color and light scatter.

In this lighting device of matrix-like construction, the total characteristic of the light emitted by the lighting device also is determined by the individual light modules arranged in the depressions of the three-dimensional carrier, i.e. when changing individual modules, the total characteristic of the lighting device must be newly determined. Since individual properties as regards color characteristic and light scatter are assigned to the individual modules of the lighting device, the total characteristic of the light emitted by the lighting device can be varied considerably in the case of the failure of individual modules.

SUMMARY

It is the object of the present invention to provide a lighting device as mentioned above, which emits light with an adjustable color, brightness and radiation characteristic, has a compact construction, provides for an autonomous operation and can be configured as desired with similar lighting devices and ensures a lighting equipment, in particular a lamphead or a surface luminaire or light panel, with substantially homogeneous, controllable light emission.

The solution in accordance with the present invention provides a lighting device which emits light with an adjustable color, brightness and radiation characteristic, has a compact construction, provides for an autonomous operation and due to its modularity can be configured as desired with similar lighting devices and ensures a lighting equipment, in particular a lamphead or a surface luminaire or light panel, with substantially homogeneous, controllable light emission. By selecting LEDs emitting light of different wavelengths and due to their arrangement and actuation, an adjustable light mixture becomes possible with an optimum color space and, in the case of white light, with an optimum color rendering.

The lighting device substantially consists of a lighting module, in which both a light source with a plurality of LEDs emitting light of different wavelengths and a module electronic for actuating the LEDs of the light source are integrated, wherein the module electronic and the LEDs are connected with a module carrier of the lighting module. By expanding the lighting module with one or more temperature and/or color sensors, which together with the LEDs are arranged in compact form on a board connected with the module carrier, an autonomous electric actuation and control of the light source by means of the module electronic including a microcontroller is possible.

In a further exemplary aspect, an optic for light mixing and/or beam forming can be coupled to the lighting module. By arranging a multitude of lighting modules, whose module electronic is connected with a superordinate control and regulating means, a controllable and adjustable light source for a lighting equipment can be produced, which can be connected with further optical means for beam forming.

By corresponding selection and composition of the LEDs emitting light of different wavelengths and their arrangement on the board of the light source and by a corresponding actuation of the LEDs by the module electronic, the lighting module can emit a light mixture whose parameters such as light color, color temperature and chrominance are adjustable beside the brightness of the light emitted by the lighting module.

A distinction substantially is made between an operating mode optimized in terms of color rendering, in which white light with very good color rendering chiefly is emitted for lighting purposes, and an operating mode optimized in terms of brightness, in which chiefly colored light with great luminous intensity is emitted for the purpose of studio, theatre and effect lighting. By correspondingly programming the lighting module and the superordinate control and regulating means or the electronic and software modules, this option can be offered to the user.

The modular design and the composition of the lighting module provides for the formation of different types and sizes of lighting equipment, for example of a lamphead or a surface luminaire.

With an individual actuation of LEDs emitting light of different wavelengths or groups of LEDs each emitting light of the same wavelength by the module electronic, a selective and temperature-independent adjustment of the light mixture consisting of the light emitted by the differently colored LEDs is ensured.

The module electronic equipped with a microcontroller provides for varying the control program for actuating the LEDs or for connecting the lighting module with a superordinate, external controller, i.e. a controller separate from the lighting module, so that the module electronic of the lighting module performs the entire control and possibly regulation of the autonomous lighting module and hence relieves the external controller.

Exemplary, the module electronic controls the LEDs in dependence on the temperature and/or performance of the lighting module and/or the brightness and/or the color of the light mixture emitted by the lighting module such that the brightness, color and chrominance of the light mixture composed of the LEDs emitting light of different wavelengths is constant, which provides for a local temperature compensation and an autonomous lighting module without the necessity or requirement of an external control and regulating means.

In a further exemplary aspect of the solution in accordance with the invention, the brightness and the chrominance of the light mixture emitted by the lighting module can be adjusted by the module electronic or be calibrated via the module electronic.

The possibility for a precise calibration of the lighting module offers the advantage that the tolerances of the LEDs used can be compensated, and provides a higher acceptance of the LED tolerances, without it being necessary to procure and keep on stock a very large number of LED selections with small tolerances to achieve lighting modules with the same behavior.

To ensure an optimum light mixture of the LEDs emitting light of different wavelengths alone by the geometry of the arrangement of the LEDs on the board of the light source already at a small distance from the lighting module and by the selection of the wavelengths emitted by the LEDs and the color possibilities resulting therefrom, the LEDs are arranged on the board of the light source with a small distance from each other, and via conductors arranged on the board and electrical terminals of the light source they are connected with the module electronic, which can be connected with the external controller via electrical terminals of the lighting module.

To provide for differently configured light sources with module electronics to be configured as desired, the interface between the light source and the module electronic is designed such that all terminals of the LEDs used are guided towards the outside of the light source, where they are connected with a board of the module electronic preferably forming the module carrier. This connection is accomplished via soldering lugs which are arranged in a standardized raster and/or via a connector of the type of multi-pole pin strips or by a direct wire or bond connection. Especially in the latter case it is possible that the light source can be constructed very small and hence at low cost and with a high luminance.

Due to this configuration of the interfaces between the light source and the module electronic of the lighting module it is ensured that to provide for example lighting devices with different color characteristics, light sources with differently composed and configured LEDs can be connected with a standardized module electronic for actuating the LEDs and the light mixture emitted by the lighting device can be regulated.

The modular design and the autonomous operation of the lighting modules easily permits dynamic color and brightness variations up to the complete switching on or off of certain regions of the luminous area or special effects, in which for example for a portrait lighting the direction from which the light is emitted can be varied by switching on a partial area of the luminous area, or color fringes can be generated selectively.

By using identical lighting modules it is possible due to this modular variability to produce both surface luminaires with a great light-emitting surface and lampheads with which bundled or expanded light is emitted. By stepless variation of the characteristic of the lighting device it is possible to vary between "spotlight" and "softlight" by operating for example a few modules in the center of the lighting device with high power (spotlight) or many modules with low power (softlight).

The radiating surfaces of the above-mentioned lampheads need not be rectangular and planar, but a multitude of possible shapes can be formed, which can be realized with the chiefly square lighting modules, such as light stripes and bars, L-shapes, rings etc. Curved radiating surfaces composed of a number of lighting modules can be formed to achieve particular effects. Furthermore, so-called "LED rope lights" can be formed in the form of movable chains which permit an arbitrary geometrical shape of the line-up, such as zig-zag shapes, circular or elliptical shapes.

To achieve a compromise of good insulation properties for the protection of the electrical connections of the LEDs with the module electronic on the one hand and the greatest possible thermal conductivity for optimum utilization of the capacity of the LEDs on the other hand, the board of the light source carrying the LEDs consists of a board made of an electrically insulating material of good thermal conductivity, preferably aluminum nitrite, or of a metal core board.

The light source and the module electronic can directly be connected with each other when e.g. the light source is directly soldered or plugged onto the module electronic or via a recess in the module electronic. In this case, a flat space-saving design is achieved. The entire lighting module can be attached to a greater heat sink or to the lamphead housing by means of screws, for example, wherein it is thermally advantageous when the light generating unit is directly coupled to the greater heat sink.

Accordingly, the module carrier can be formed like a plate, include a recess for inserting the board configured as a plate and/or the base of a module heat sink, and for fastening the board and/or the module heat sink include mounting holes and connecting elements for connecting the module carrier with a motherboard.

To be able to optimally utilize the capacity of the LEDs without impairing their useful life, the board of the light source is connected with a module heat sink in a manner with good thermal conductivity and preferably arranged on a base of the module heat sink elevated with respect to a surface of the module heat sink, so that the board is arranged at an elevated position with respect to the surface of the module carrier, whereas the surface of the module heat sink accommodating the base includes fastening elements for connecting the module heat sink with the module carrier.

In an alternative embodiment, the light source and the module electronic can be attached to a common carrier component, such as the module heat sink. With equally good heat dissipation, this embodiment offers the advantages that a safe and simple mechanical connection can be made between the entire lighting module and a lamphead housing or a cooling means via standard fastening elements such as screws, pins and the like, and that the board or the module carrier of the module electronic is not subjected to a mechanical load. The module heat sink preferably is made of a material with very good thermal conductivity, such as copper or aluminum.

In an exemplary embodiment, the light generating unit is mounted at a higher level with respect to the module electronic, so that fastening elements, such as screws or grooved pins, and electronic components can also be accommodated on the upper surface of the module electronic without disturbing the optical path of the LEDs. In this way, a down-stream optic can collect all light beams radiated into the half space and thus can be configured very efficient.

The module carrier in particular is plate-shaped, so that it also forms the board of the module electronic. Preferably, it has a contour for a substantially uninterrupted line-up of a multitude of similarly formed module carriers and hence lighting modules for a light-emitting surface of a lighting equipment.

To form a greater light source for a lighting equipment, the module carriers of a plurality of lighting modules can be inserted in mounts of a motherboard including an external controller.

In an exemplary embodiment, the module electronic consists of a power supply circuit, a digital electronic with a microcontroller and a number of similar drive circuits for the various color channels, so that by using a plurality of similarly configured drive circuits for actuating individual LEDs or for simultaneously actuating a plurality of LEDs each emitting light of the same wavelength a modular design of the module electronic itself also is ensured. The drive circuits each are connected to an output of the microcontroller emitting pulse-width-modulated control signals and provided with a supply voltage.

To account for the chip families of the LEDs differing according to the manufacturing technology, and to minimize power losses of the lighting modules, a plurality of supply voltages are provided which are associated to the individual drive circuits or the drive circuits combined in groups. In accordance with another feature of the invention, the module electronic correspondingly is supplied with one or more operating voltages and generates, stabilizes and limits the required LED currents themselves.

The drive circuits include a temperature-compensated constant-current source, which is connected to a supply voltage associated to the drive circuit and actuates an electronic switch connected in series to the LEDs fed by the respective drive circuit such that the LEDs are fed with constant current.

A digital, serial interface to the microcontroller substantially allows the actuation of the color channels, the calibration, the retrieval of status information from the lighting module, such as the board temperature, and the overloading of the operating program (download). The interface to the lighting module preferably is network-compatible and designed in the manner of an industrial field bus, so that a greater number of lighting modules can also be operated on a bus.

In particular when connecting a plurality of similarly configured lighting modules of a lighting device, the module electronic is capable of exchanging data with an external controller via a serial interface and to actuate the LEDs via preferably pulse-width-modulated signals for stepless actuation of the LEDs.

If a plurality of lighting modules are combined to one larger lamphead, it is possible that different parts of the lamphead are heated differently. This is effected e.g. by external heating by the sun or by another lamphead located nearby, or by convection inside the lamphead itself, where the warm air rises upwards. These effects would result in the lighting modules radiating different degrees of brightness. Thus, the lamphead would no longer be uniformly bright over the radiating surface, but a gradient would be obtained in the direction of the coolest point. The configuration of the lighting modules with a microcontroller and a digital interface, however, allows that the lighting modules measure their board temperature and transmit the same to other bus participants. With these data, a central master module or an external controller can therefore counteract the above-mentioned effect by actuating the lighting modules such that a uniform brightness again is obtained over the radiating surface.

In a lighting device composed of a plurality of similarly constructed lighting modules, the master module or the external controller performs a periodic scan of all board temperatures of the lighting module and emits a signal representing the highest temperature determined to all lighting modules, which after a synchronization command perform a brightness adaptation on the basis of the signal representing the highest temperature determined.

An equivalent compensation of the above-mentioned effects can be achieved when the lighting modules are equipped with a brightness sensor and/or color sensor, whose signals can be evaluated and transmitted. In this case, the correction is effected directly via the brightness or color and not via the board temperature.

Due to the composition of the light generating unit of LEDs emitting light of different wavelengths, a desired light mixture can be adjusted without a change in hardware by merely actuating the LEDs by means of the module electronic and can possibly be compensated and/or regulated autonomously by incorporating a brightness and/or color sensor.

Exemplary, the LEDs are configured as LED chips, which are electrically contacted with the conductors of the board in a chip-on-board technology, preferably by bonding, flip-chip contacting or conductive gluing.

Since the LEDs are configured as LED chips, which exemplary are connected with the board by bonding, a simple manufacture and integration of the LEDs into the lighting module is ensured by simply contacting existing conductors and terminals provided at the edge of the board of a light source, and the prerequisite for example for the automatic equipment of the board of the light source with LEDs emitting light of different wavelengths is fulfilled.

To provide different brightnesses, light characteristics and color spaces in consideration of an optimum light and color mixture, a different configuration of the LEDs on the board of the light source is possible. Thus, in the center of the board at least one LED chip emitting white light and around the same in a rotationally symmetric arrangement, at the same angular intervals and on concentric circles around the center of the board, a plurality of LED chips emitting colored and/or white light can be arranged, a number of n LED chips is provided, n/3 of which are LEDs emitting white or warm white light and n/6 of which each are LEDs emitting red, blue, green and yellow or amber-colored light, in particular four LED chips can form an inner square and eight further LED chips are concentrically arranged on a circle around the center of the inner square or in pairs on the sides of an outer square arranged concentrically with respect to the inner square, wherein either four LED chips emitting white or warm white light form the inner square and two LED chips each emitting red, blue, green and yellow or amber-colored light are concentrically arranged on a circle around the center of the inner square, each offset with respect to each other by 180° and by 45° with respect to the adjacent LED chips, or four LED chips emitting colored light form the inner square and one LED chip each emitting white or warm white light is arranged in pairs with an LED chip emitting colored light on the sides of an outer square arranged concentrically with respect to the inner square.

In all variants, a close arrangement and placement of the LEDs of a lighting module on the board is possible and an optimum light mixture of the differently colored LEDs is ensured.

A further exemplary aspect of the lighting device of the invention is characterized in that at least the LEDs of the light source arranged on the board are coated with a light-permeable potting compound.

The light-permeable potting compound serves both as a mechanical protection for bonding the LEDs and the conductors to the terminals of the light source arranged in a raster and also as a protection against soiling of the light source.

To ensure a compact construction of the lighting module and to simplify and reduce the costs of the manufacture of the lighting module, the potting compound of a further aspect can be of the optically active type, so that for example the refractive index of the potting compound selectively is used to be able to better utilize an optic arranged down-stream in emission direction, i.e. to be able to better couple in the light beams emitted by the light source for the downstream optic of the lighting module.

A further exemplary aspect of the light source is characterized in that a ring preferably made of plastics is arranged around the LEDs, is white or mirrored on the inside for optimum light reflection and is connected with the surface of the board for example by an adhesive bond, wherein the ring in particular is made of plastics and has a defined distance to the outer LEDs and a predetermined height.

The arrangement of a ring in particular of plastic material around the LEDs of the light source serves as a defined spacer for flange-mounting a downstream optic of the lighting module and, in the configuration where the interior of the ring is filled with the light-permeable potting compound, as a limitation of the potting compound and for the simplified application thereof onto the LEDs of the light source.

In a further exemplary aspect of the light source, the ring is cylindrical or oval in shape and white or mirrored on the inside to ensure optimum reflection properties.

An optic can be coupled to the lighting module or to a plurality of lighting modules combined to one group of lighting modules.

To optimize the efficiency of the light radiated by the lighting device, to achieve a maximum brightness of the light radiated by the LEDs of the light sources and to prepare the radiated light for further optically influencing the light radiated by the lighting module, the light source of a first embodiment is connected with a primary optic, which bundles or "collects" the light beams emitted by the LEDs. At least parts of the primary optic are made of polymethyl methacrylate (PMMA) or polycarbonate (PC). This primary optic can be provided both in addition and as an alternative to an optically active potting compound.

With the primary optic, e.g. wide-angled "softlights", which have a homogeneous radiating surface, and narrow-angled "spotlights", which homogeneously illuminate a distant surface, and also mixed forms of these two types of lamphead can be realized with the lighting module of the invention.

For the further exemplary treatment of the light beams emitted by the light-collecting optic, the primary optic can include an optical assembly for light and/or color mixing, which generates the desired radiation characteristic. This assembly preferably consists of a so-called honeycomb condenser, which by means of a precisely constructed arrangement of microlenses intermixes the light beams arriving from the first optic and again radiates the same.

A secondary optic downstream of the primary optic serves for further beam forming, but can also be used for the (additional) light and/or color mixing. It preferably consists of a lens, a lens array or a microlens array and further expands the optical path, so that a greater scattering angle and/or a different illuminance distribution is obtained. By combining a preferably firmly mounted primary optic with a number of different secondary optics a modular system can be created, which provides a number of desired light distributions to the user. In particular, the secondary optic can be configured as a projection optic with narrow half-peak angle, can provide a spot optic with homogeneous illumination and narrow half-peak angle with high efficiency, can consist of a soft optic with homogeneous illumination and great half-peak angle with high efficiency.

In a particular exemplary embodiment, the secondary optic consists of a zoom optic, which includes two microlens plates adjustable with respect to each other in emission direction of the lighting module by motor, pneumatically or hydraulically for focussing, i.e. for expanding or concentrating the light beams emitted by the LEDs. Thus, it is possible to generate a lighting device which in operation largely corresponds for example to a conventional studio or film lamphead and which has a dynamically variable half-peak angle of e.g. about 20°-60°.

To simplify the manufacture of the lighting module thus equipped with a primary optic and/or a secondary optic, the primary optic and/or the secondary optic can be flange-mounted to the ring of light source.

When the radiation characteristic of the lighting module or the lamphead consisting of lighting modules should be varied further and possibly dynamically, a tertiary optic or another light-influencing element can be provided subsequently. The tertiary optic relates to commercially available accessories, which substantially are provided for shading off stray light and for soft-focusing, such as diffusers, diffusing screens, barn doors, egg crates and holographic diffusion foils.

For the functional expansion of the lighting module or a lighting device composed of a plurality of similarly constructed lighting modules, the light source and/or the primary optic and/or the secondary optic can be connected with a means for coupling out light, in particular with a light guide or with a mirror or prism system.

An autonomous module electronic, which is connected with at least one sensor arranged on the carrier element, preferably with a brightness, temperature and/or color sensor, provides for an automatic operation of the lighting module or of a lighting device composed of a plurality of lighting modules without external control, wherein the possibility of keeping constant the specified and adjusted light and color characteristics of the lighting module and of the lighting device for instance independent of the temperature still is maintained.

BRIEF DESCRIPTION OF THE DRAWINGS

With reference to several embodiments illustrated in the drawing further features and advantages of the invention will be explained.

FIG. 2 shows a schematic block diagram of a plurality of lighting modules connected with a primary optic and a common secondary and tertiary optic for the group of lighting modules.

FIG. 19 shows a schematic overview diagram of a lighting system with one LED panel and a plurality of LED panels.

DETAILED DESCRIPTION

Figure 1:
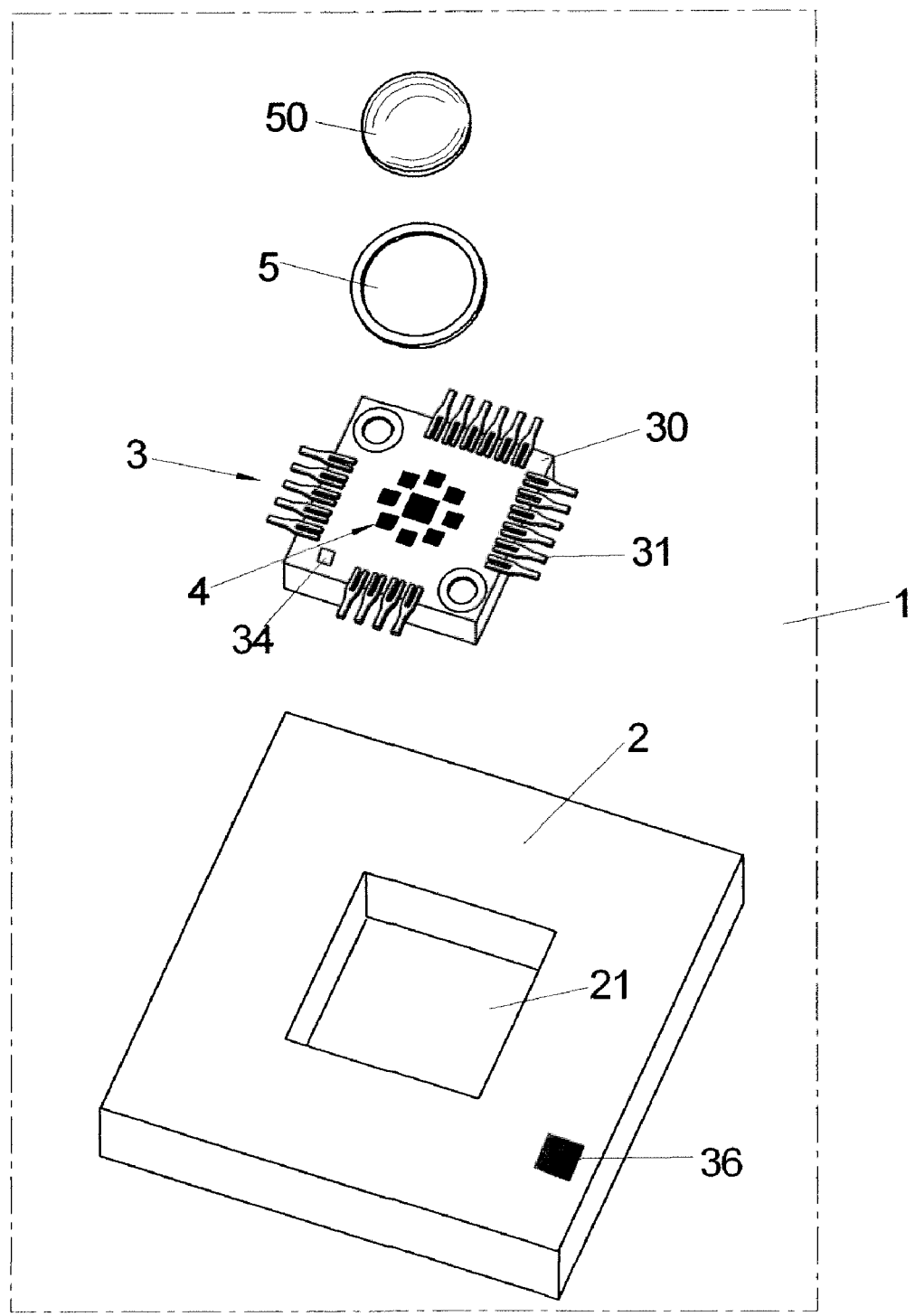
FIG. 1 shows a schematic exploded view of a lighting module with a module carrier with integrated light source and module electronic.

In a schematic exploded view, FIG. 1 shows a lighting module 1 which is employed singly or with a plurality of identically or similarly constructed lighting modules in a lighting device such as a lamphead, a surface luminaire or the like.

In its basic form, the lighting module 1 is composed of a module carrier 2 formed as circuit board with a module electronic 20 arranged thereon and a light source 3, which consists of a board 30 with a plurality of light-emitting diodes (LEDs) 4 arranged on the board 30, a temperature sensor 34 likewise arranged on the board 30, and contacts 31 arranged at the edge of the board 30 and formed as soldering lugs, which are connected with the LEDs 4 and the module electronic 20. A detailed description of the light source 3 will be given below with reference to the enlarged representation of the light source 3 in FIG. 3.

The LEDs 4 are composed of a plurality of LEDs which emit light of different wavelengths, i.e. of different colors, wherein several LEDs also can radiate the same wavelength, i.e. light of the same color. By close arrangement of the LEDs 4 on the board 30, there is already generated a light mixture of the different colors adjustable by corresponding selection of the LEDs, which is further optimized by additional measures such as optical light bundling and light mixing and can be kept constant by further control and regulating measures, for example independent of the temperature, in order to be able to adjust a desired color temperature, brightness and the like.

For the space-saving arrangement and expansion of the modularity of the lighting module 1, the light source 3 is inserted into a recess 21 of the module carrier 2, so that the configuration of the light source 3 can be effected independent of the configuration of the module carrier 2 or the module electronic 20, when it is ensured that the interfaces between the light source 3 and the module electronic 20 are designed correspondingly.

Alternatively, the light source 3 or the board 30 can be arranged on the base of a heat sink, corresponding to the embodiment shown in FIGS. 10 to 13, and the same can be inserted through the recess 21 of the module carrier 2.

To optimize the light emitted by the lighting module 1 schematically shown in FIG. 1, the lighting module 1 can be expanded with an optic or several optics corresponding to the schematic representation of FIG. 2.

To expand the lighting module 1 consisting of the module carrier 2 with the module electronic 20 and the light source 3, a ring 5 can be connected with the board 30 of the light source 3, which encloses the LEDs 4 and possibly is filled with a preferably optically active potting compound 6 collecting the light beams emitted by the LEDs 4. Alternatively, the potting compound 6 can cover the LEDs 4 of the light source 3 in a bell-shaped or cylindrical manner, without the LEDs 4 being enclosed by the ring 5.

FIG. 2 shows a schematic representation of a plurality of lighting modules 1.1, 1.2 to 1.N with a primary optic 7.1, 7.2 to 7.N coupled to the lighting modules 1.1, 1.2 to 1.N and a secondary optic 8 associated to all primary optics 7.1, 7.2 to 7.N, to which a tertiary optic 9 can be coupled.

The primary optic 7 substantially serves for bundling the light emitted by the light source 3 of the lighting module 1 by means of a light bundling device 71 and/or for the uniform brightness distribution of the light emitted by the LEDs 4 of the light source 3 by means of a light mixing device 72 and/or for color mixing the light of different wavelengths and hence of different colors emitted by the LEDs 4 of the light source 3 by means of a color mixing device 73, wherein at least parts of the primary optic 7 are made of polymethyl methacrylate (PMMA) or polycarbonate (PC).

While the lighting module 1 and the primary optic 7 are a firm part of the modular lighting module 1 of the lighting device, the secondary optic 8 and the tertiary optic 9 form an optional and/or movable part which can be adapted to the specific requirements of an expanded lighting module of the modular lighting device.

The secondary optic 8 in particular serves for beam forming, but is also used for the additional light and/or color mixing. In a particular embodiment, it consists of a zoom optic, which includes two microlens plates 81, 82 adjustable with respect to each other in emission direction of the lighting module 1 by motor, pneumatically or hydraulically for focussing, i.e. for expanding or concentrating the light beams emitted by the LEDs 4. Thus, it is possible to produce a lamphead which in operation largely corresponds to a conventional studio or film lamphead and which has a dynamically variable half-peak angle of e.g. about 20°-60°. Alternatively, however, the secondary optic 8 can also consist of a condenser lens, in particular of a honeycomb condenser.

The tertiary optic 9 coupled to the secondary optic 8 substantially serves the variation of the radiation angle and for example consists of
- a diaphragm device in the form of barn doors 91 for the lateral limitation of the light radiated by the lighting device,
- iris diaphragms,
- elements for beam forming or for generating special effects such as a grating, diffuser 92, gobo or scrim 93,
- light guides, mirror or prism systems for light outcoupling or light coupling.

The schematic representations of FIGS. 1 and 2 show all elements of which the lighting module 1 of the invention of a modular lighting system can be composed, wherein with the exception of the lighting module 1 shown in FIG. 1 individual or all components 5 to 9 including the ring 5 and of the potting compound 6 are omitted or with respect to the secondary and tertiary optics 8, 9 can be provided both for individual expanded lighting modules 1 and as common components for a plurality of modular lighting modules 1 each with a separate expanded lighting module 1 composed of the module electronic 2, the light source 3, optionally the ring 5 and the potting compound 6 as well as the primary optic 7. For example, a lamphead or a surface luminaire can be composed of
- a plurality of lighting modules 1 each having a separate primary optic 7 with a common secondary optic 8 and/or tertiary optic 9;
- a plurality of lighting modules 1 with a common primary optic 7; and
- a plurality of expanded lighting modules 1 with a common primary optic 7 and/or secondary optic 8 and/or tertiary optic 9.

As shown in FIGS. 1 and 2, the lighting module 1 in its basic form consists of the module carrier 2 with the module electronic arranged thereon and the light source 3 arranged on the board 30 and provides a compact, universally usable, microprocessor-controlled lighting device with light-emitting diodes or LEDs 4, which has a very good color rendering and a great adjustable color space.

The preferably cylindrical or oval ring 5, which optionally is arranged around the LEDs 4 of the light source 3 as an expansion of the lighting module 1 is connected with the board 30 accommodating the LEDs 4 by means of an adhesive bond, preferably is made of plastics and is white or mirrored on the inside facing the LEDs 4, in order to optimally reflect the light beams, and has a defined distance to the outer LEDs 4 and a specified height.

Figure 6:
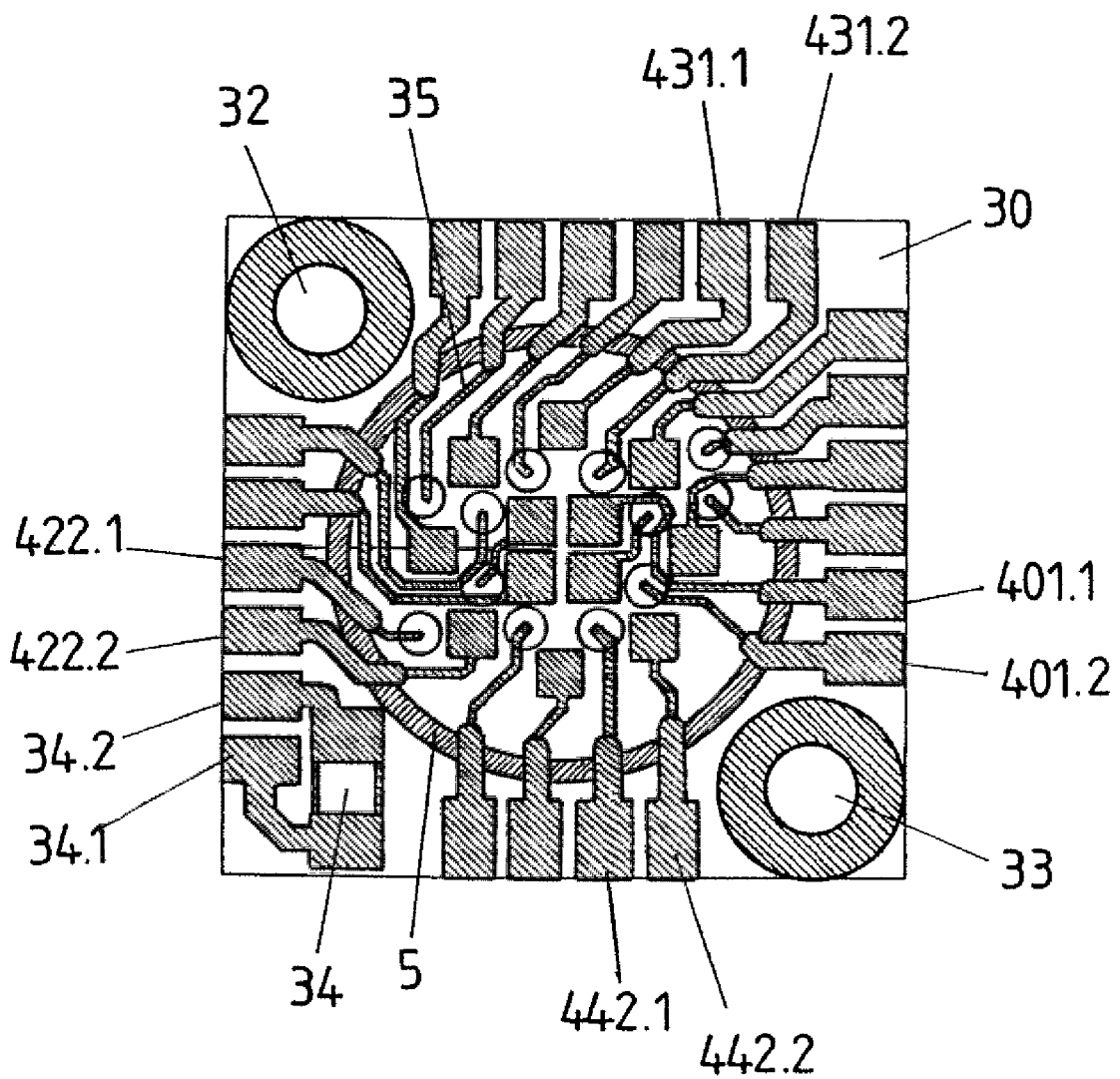
FIG. 6 shows a top view of the layout of the light source shown in FIG. 4.

The transparent potting compound 6 serves as a protection both for the LEDs 4 mounted on the board 30 and for the conductors 35 connecting the LEDs 4 with the raster-like contacts 31 formed as soldering lugs as shown in FIG. 6, and in addition can also serve as an optically functional element for light mixing, light bundling, light scattering or the like of the light radiated by the LEDs 4.

In a preferred embodiment, the potting compound 6 fills the space formed by the cylindrical ring 5, in that the potting compound 6 is introduced into the space formed inside the ring 5 after connecting the ring 5 with the board 30 of the light source 3. The potting compound 6 can terminate flush with the upper edge of the ring 5 or be formed convex or concave to perform optical functions.

Figure 3:
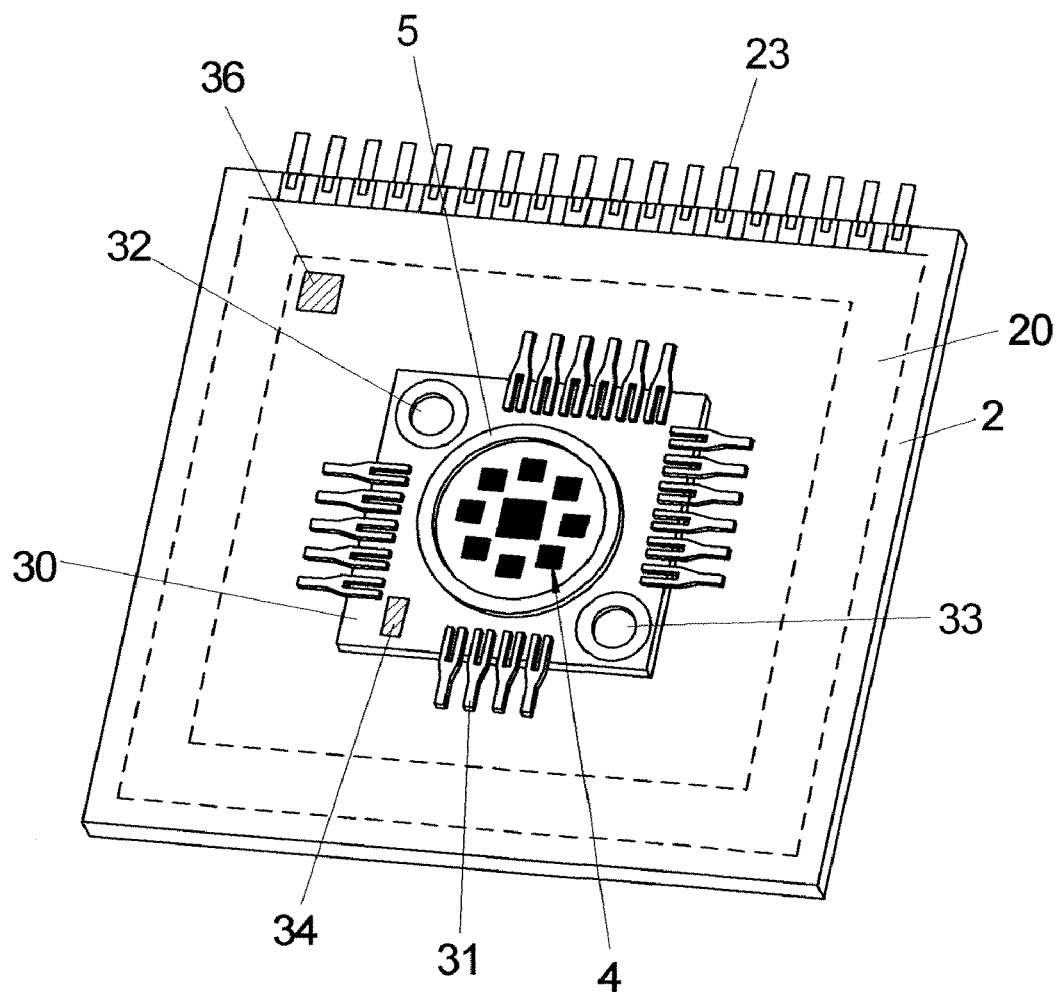
FIG. 3 shows a perspective representation of a basic lighting module with a light source arranged on a carrier plate and a module electronic.

As shown in FIG. 3, the board 30 of the light source 3, which is inserted into the recess 21 of the module carrier 2, is connected with a heat sink by means of connecting screws, which are inserted through bores 32, 33 in the corner regions of the board 30, which heat sink employs various cooling techniques in dependence on the respectively provided or required performance of the LEDs and is formed for example as vented heat sink with cooling fins or the like, as heat pipe or as liquid-cooled heat sink. The connection of the light source 3 with the module electronic 20 schematically shown in FIG. 3 as a dashed frame around the recess 21 is effected via the contacts 31 formed as soldering lugs at the edge of the board 30, which are soldered to the conductors of the module carrier 2.

In a first alternative to a separate arrangement and thermal connection of a heat sink with the board 30 of the light source 3, the module carrier 2 can also constitute a vented heat sink with cooling fins, as heat pipe or as liquid-cooled heat sink.

In a second alternative, the light source 3 or the board 30 can be arranged on the base of a heat sink and the same can be inserted through the recess 21 of the module carrier 2, as will be explained below with reference to the embodiment shown in FIGS. 10 to 13.

Furthermore, a temperature sensor 34 is arranged on the board 30, which detects the board temperature of the board 30 and hence preferably of the LEDs 4 bonded onto the board 30 and issues a temperature signal to the module electronic 2.

Figure 4:
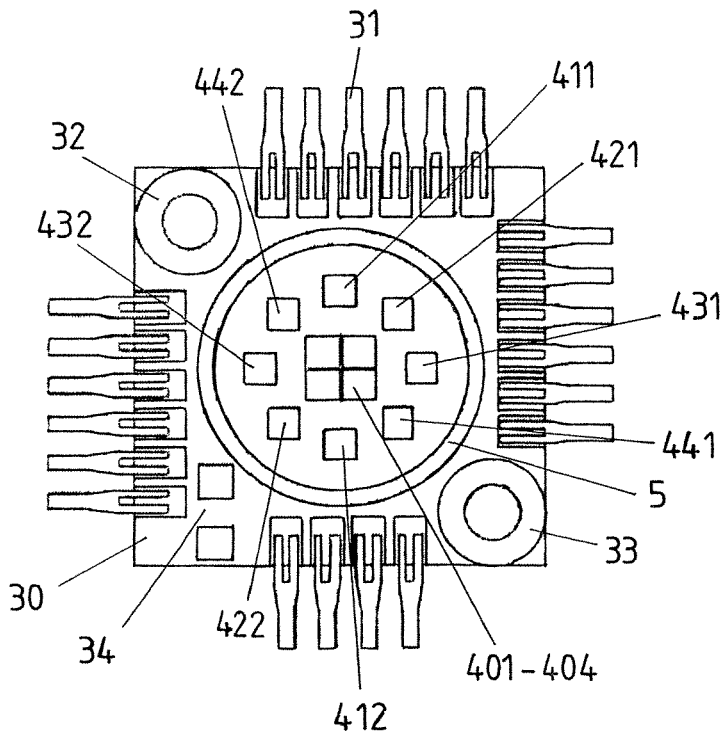
FIG. 4 shows a top view of the light source with ten LEDs, a temperature sensor and electrical contacts arranged in a raster.
Figure 5:
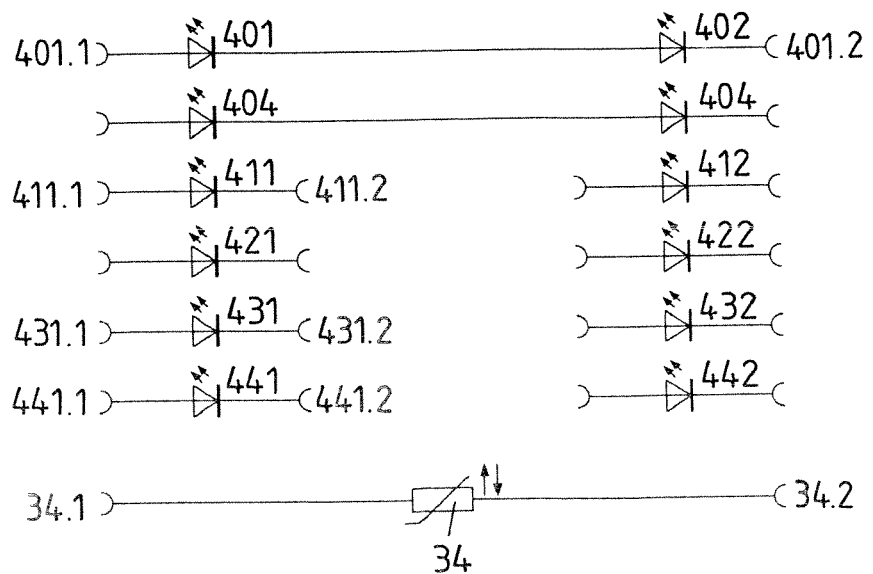
FIG. 5 shows a representation of the circuit diagram of the light source of FIG. 4.

The first embodiment of a light source 3, which is shown in FIG. 4 in a top view, in FIG. 5 as a circuit diagram, and in FIG. 6 as a layout of the switching connections, contains twelve LEDs 401-442, which preferably consist of 1 $mm^2$ power chips of a color group and are arranged on the board 30 formed as ceramic board by a chip-on-board technology. The twelve LED chips 401-442 are composed of

- four LEDs 401-404 combined in the center of the light source 3, emitting white light with a dominant wavelength of 3,200° K., connected in series in pairs and provided with a chip coating, and
- color LEDs 411-442 arranged concentrically and in a rotationally symmetric arrangement around the LEDs 401-404 emitting white light, of which two LEDs each of the same type or emitting the same color, namely LEDs 411, 412 emitting red light, LEDs 421, 422 emitting green light, LEDs 431, 432 emitting blue light, and LEDs 441, 442 emitting yellow or amber-colored light, are arranged on the board 30 each offset by 180°.

The LEDs 401-442 originate from a brightness group which consists of the upper third of all brightness groups available, and for optimum light mixing are closely combined on the carrier plate 30.

The LEDs 401-442 of the light source 3 are arranged and selected with respect to the light of different wavelengths emitted by them such that a variable light mixture is achieved by separate control of the five and possibly six color groups. In this way, a color temperature between 2,000° K. and 25,000° K. with a color rendering index CRI>90 between 2,200° K. and 12,000° K. or CRI>94 between 3,200° K. and 6,500° K. is achieved with a power consumption of 13.9 W at a rated LED current of 350 mA and a light flux of 320 lm at rated power and a junction temperature of $T_j=100°$ C.

Beside the LEDs 401-442 mounted or bonded on the board 30 by chip-on-board technology, the light source 3 includes the following components at least partly bonded or soldered onto the board 30

- the temperature sensor 34 constituting an NTC resistor for temperature measurement,
- the electrical contacts 31 constituting soldering lugs (lead frames), which are connected with the module electronic 20 and are arranged in a raster of 1.27 mm,
- conductors 35 leading from the LEDs 401-442 to the electrical contacts 401.1-442.2, and optionally

- the ring 5 arranged around the LEDs 401-442 and in particular serving as an optic flange for example with an inside diameter of 8 mm and an outside diameter of 9 mm and a height of 0.7 mm, and
- the potting compound 6 for protection of the LEDs 401-442 and possibly the conductors 35 and as an optically functional component.

The circuit diagram of the light source 3 shown in FIG. 5 illustrates the serial connection of the LEDs 401-442 emitting white light and of the color LEDs 411-442 arranged offset with respect to each other by 180° in a rotationally symmetric arrangement around the LEDs 401-404 emitting white light, and of the temperature sensor 34 constituting an NTC resistor, which is connected with the electrical contacts 34.1 and 34.2 of the raster-like arrangement of the contacts 31 of the light source 3 formed as soldering lugs.

FIG. 6 shows the layout of the connections of the LEDs 401-442 of the light source 3 with the contacts 31 arranged in a raster at the edge of the board 30 via conductors 35 and the layout of the temperature sensor 34, which belongs to the representations of FIGS. 4 and 5, and illustrates the electrical conductors 35, which even with a closely spaced arrangement of the LEDs 401-442 to achieve an optimum light mixing are easy to install, and the contours of the cylindrical ring 5 of the light source 3 and the diametrically arranged bores 32, 33 for connecting the board 30 of the light source 3 with the module carrier 2 or a heat sink.

Corresponding to the circuit diagram as shown in FIG. 5 and the layout shown in FIG. 6, two LEDs 401 and 402, 403 and 404 emitting white light each are connected in series to the contact surfaces 401.1 and 402.2, 403.1 and 404.2, respectively, which are connected with the corresponding contacts 31 at the edge of the board 30 of the light source 3. Analogously, the LEDs 411, 412 emitting red light are connected with the contact surfaces 411.1 and 411.2, 412.1 and 412.2, the LEDs 421, 422 emitting green light are connected with the contact surfaces 421.1 and 421.2, 422.1 and 422.2, the LEDs 431, 432 emitting blue light are connected with the contact surfaces 431.1 and 431.2, 432.1 and 432.2, and the LEDs 441, 442 emitting yellow or amber-colored light are connected with the contact surfaces 441.1 and 441.2, 442.1 and 442.2, respectively.

The module electronic 20 on the module carrier, which is schematically illustrated in FIG. 3 in broken lines, includes a microprocessor circuit arranged on the module carrier 2 equipped on both sides and formed as circuit board, which for example is arranged around the recess 21 accommodating the light source 3 or the base 161 of the module heat sink 16 and which processes commands received on its serial interface and therefrom generates control signals for actuating the LEDs 401-442 via the contacts 31 arranged in a raster, which are connected with the individual, series-connected LEDs 401-442 via the conductors 401.1-442.2 The actuation of the LEDs 401-442 preferably is effected via precise, pulse-width-modulated control signals, whose pulse width can be adjusted for stepless dimming of the LEDs from 0% to 100%.

In the embodiment shown in FIGS. 3 to 6, the module electronic 2 generates six pulse-width-modulated control signals for actuating the LEDs 401-442 of the light source 3, with the following signals or values being processed on each color channel

- the brightness of the white or colored light emitted by the LEDs 401-442 by specifying a desired current value $I_{DES}$ from the serial interface,
- the basic brightness due to an uncorrected brightness of the color channel under nominal conditions,
- the temperature by the temperature signal $T_{Board}$ issued by the temperature sensor 34 of the light source 3,
- a characteristic curve control with the coefficients A, B, C for the temperature compensation of the brightness with a quadratic characteristic curve ($I=A \times T_{Board}^2 + B \times T_{Board} + C$), and
- the system temperature, i.e. the highest temperature $T_{max}$ in the lighting device or the lighting module 1 for compensating convection-related differences in brightness.

The module carrier 2 copper-clad on both sides and equipped on both sides by SMD (Service Mounted Devices) technology for example has the outer dimensions 36×36 mm with a recess of 14×14 mm for accommodating the light source 3 and includes at least one contact strip 23 as an outer terminal as well as the inner terminals formed as soldering surfaces to the contacts 31 of the light source 3.

The individual lighting modules 1 containing the module electronic 20 operate as bus slaves and do not start a spontaneous communication. In the case of an interconnection of a plurality of lighting modules 1 to form a total system of a modular lighting device, an external controller connected with the module electronics 20 of the individual lighting modules 1 via serial interfaces performs a periodic scan of all board temperatures of the lighting modules 1 in the total system and subsequently sends the highest temperature determined back to the individual module electronics 20 of the lighting modules 1 of the total system. After a synchronization command, all lighting modules 1 perform a brightness adaptation on the basis of this temperature value sent back to the lighting modules 1, in order to compensate convection-related brightness differences between the individual lighting modules 1.

In one embodiment, the color signals issued to the LEDs 4 of the individual lighting modules 1 have a maximum voltage of 9 V at a maximum current of 350 mA. The pulse width modulation is performed with a frequency f≧25 kHz at a 12 bit resolution. The effective current control is effected with a tolerance of $\Delta I_{EFF} \leq \pm 1\%$ by regulating the maximum current value $I_{MAX}$ to ±10% and/or by compensating the pulse width of the pulse width modulation.

Figure 7:
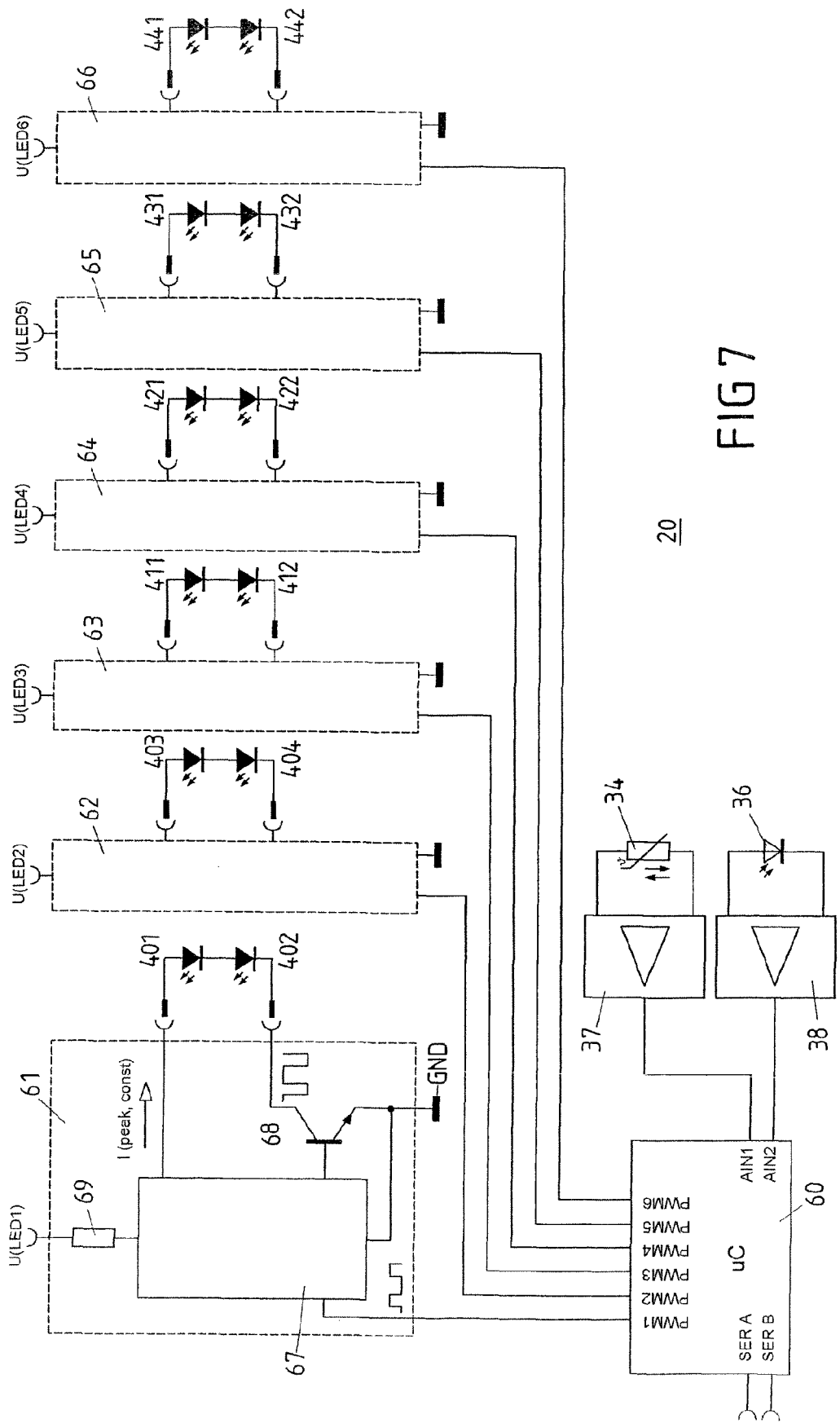
FIG. 7 shows a block circuit diagram of a module electronic with similarly constructed drive circuits.

FIG. 7 shows a functional circuit diagram of the module electronic 20 for actuating six groups of LEDs each with two series-connected LEDs 401, 402; 403, 404; 411, 412; 421, 422; 431, 432; 441, 442 emitting light of the same wavelength and for regulating the light mixture emitted by the LEDs by brightness actuation of the individual LED groups by means of a pulse-width-modulated control voltage and actuation of a temperature-stabilized power source for feeding the LED groups.

The module electronic 20 contains a microcontroller 60, which issues six pulse-width-modulated control voltages PWM1 to PWM6 to six identically constructed constant-current sources 61 to 66. The microcontroller 60 is connected with an external controller via a serial interface SER A and SER B and includes inputs AIN1 and AIN2, which are connected with a temperature sensor 34 and a brightness or color sensor 36 of the lighting module via amplifiers 37, 38.

The identically constructed power sources 61 to 66 are temperature-stabilized very well and contain a temperature-stabilized constant-current source 67 which is connected with one output PWM1 to PWM6 each of the outputs PWM1 to PWM6 of the microcontroller 60, which emit the pulse-width-modulated control voltages, and are connected to a supply voltage $U_{LED1}$ to $U_{LED6}$ via a resistor 69. The output of the temperature-stabilized constant-current source 67 is connected with the anode of the series-connected LEDs of an LED group, which each emit light of the same wavelength, and with the control terminal of an electronic switch 68, which on the one hand is connected with the cathode of the series-connected LEDs and on the other hand with ground potential GND.

The temperature-stabilized constant-current source 67 is characterized by a fast and clean switching with a switching frequency of 20 to 40 kHz. To keep the power loss of the lighting module as low as possible, the LED chips differing in their manufacturing technology are fed with up to six different supply voltages $U_{LED1}$ to $U_{LED6}$.

With the arrangement of the temperature-stabilized power sources 61-66 on the module carrier of the lighting module, the modularity of the system is improved and the voltage supply is simplified. In the case of a reduction of the different supply voltages $U_{LED1}$ to $U_{LED6}$ by using only two different voltages for the voltage supply of the power sources 61 to 66 combined in groups, for example for the red and yellow LEDs on the one hand and the blue, green and white LEDs on the other hand, the lighting module only requires five interfaces, i.e. a connection of the lighting module via five lines, namely two supply voltages $V_{LED1}$ and $V_{LED2}$, ground potential GND and the serial interfaces SER A and SER B with an external controller 10 (FIG. 15) for the superordinate control and regulation of a multitude of similarly constructed lighting modules.

The arrangement of the LEDs 4 of a light source 3 shown in FIGS. 3 to 6 with four LEDs combined in the center of the light source 3, emitting white light and series-connected in pairs and of color LEDs arranged around these LEDs emitting white light concentrically and in a rotationally symmetric arrangement can be varied in dependence on the respective object by maintaining a closely spaced arrangement of the LEDs 4 on the board 30 of the light source 3 for optimum light mixing.

Figure 8:
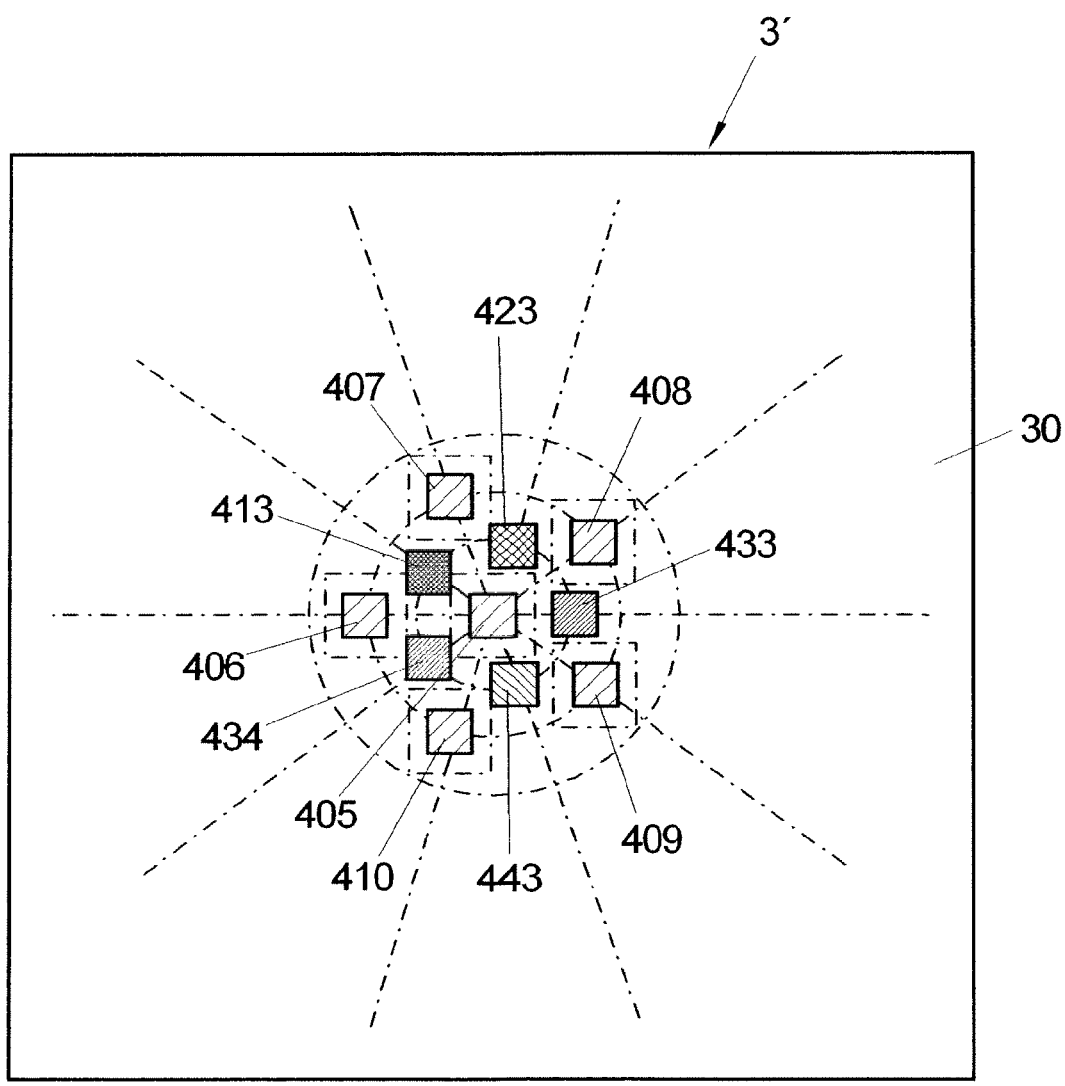
FIG. 8 shows a top view of a light source with an alternative arrangement of LEDs.

FIG. 8 shows a top view of a light source 3' with an alternative arrangement of eleven LEDs 405 to 443 on a board 30, which emit light of different colors. The LEDs 405 to 443 are arranged in the center and on two concentric circles around the center and on the two concentric circles at equal angular intervals, so that on the one hand it is ensured that the LEDs 405 to 443 are closely spaced on the board 30 and on the other hand provide an outer circular limitation which is optimally suited for flange-mounting an optic to the light source 3'.

In the center of the LED arrangement of FIG. 8, an LED chip 405 emitting white, in particular warm white light with a color temperature of 3,200° K. is arranged. On the outer one of the concentric circles, five LED chips 406 to 410 likewise emitting white, in particular warm white light are arranged, while on the inner one of the two concentric circles a first LED chip 433 emitting blue light, an LED chip 443 emitting yellow or amber-colored light, a second LED chip 434 emitting blue light, an LED chip 413 emitting red light, and an LED chip 423 emitting green light are arranged. The LED chips 405 to 443 arranged both on the inner circle and on the outer circle of the two concentric circles are arranged at equal angular intervals of 72°, and the LED chips 413, 423, 433, 443 and 434 arranged on the inner one of the two concentric circles are offset by an angle of 36° with respect to the LED chips 406 to 410 arranged on the outer one of the two concentric circles.

Figure 9:
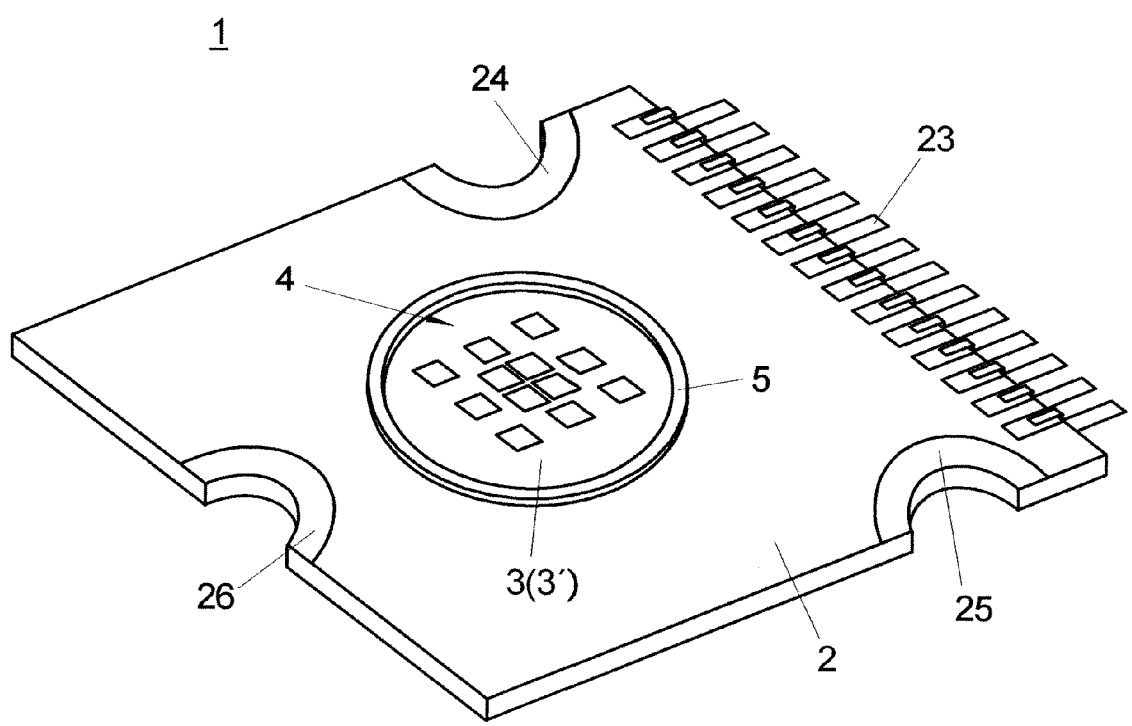
FIG. 9 shows a perspective representation of a basic lighting module suitable for lining up similar lighting modules.

As an exemplary embodiment, FIG. 9 shows a perspective representation of a lighting module 1 suitable for lining up similar lighting modules, which is composed of a tetragonal module carrier 2 formed as circuit board, a light source 3 or 3' with several, in this embodiment twelve LEDs 4, which in pairs emit light of different wavelengths and hence colors, a ring 5 and a contact strip 23. On the two sides adjoining the contact strip 23 and on the side opposite the contact strip 23, semicircular mounting holes 24, 25, 26 are provided, which by attaching further, similarly formed tetragonal module carriers 2 with semicircular mounting holes 24, 25, 26 provide a closed circular shape of the mounting holes for receiving fastening elements, so that the lighting modules joined in this way provide a modular lighting device formed for example as a lamphead or surface luminaire.

Alternatively, lighting devices can also be formed of lighting modules with a triangular module carrier 2, which analogous to the lighting module described above with reference to FIG. 9 include semicircular mounting holes which are closed when lining up further, similarly constructed triangular carrier plates to a circular shape for receiving fastening elements.

Furthermore, by lining up lighting modules with a triangular carrier plate and from lighting modules with tetragonal carrier plates, possibly also by rotating individual lighting modules to the left and to the right, arbitrary geometrical shapes can be generated for a lighting device, for example for a lamphead, for light panels, ring lights for camera lenses, light chains, LED rope lights or LED chains with panels joined in a zigzag shape, and the like.

In FIGS. 10 to 13, a further embodiment of a lighting module 1 is shown in its details and in the assembled condition, which beside an optimum dissipation of heat is characterized by a safe and simple mechanical connection between the lighting module 1 and a lamphead housing or a cooling means, wherein the module carrier 2 is not subjected to a mechanical load and the light source 3 is arranged such that the optical path of the LEDs 4 of the light source 3 is not disturbed by fastening elements on the module carrier 2 or by electronic components of the module electronic 20, which are arranged on the module carrier 2 formed as cuboid metal core board 300, so that the optic arranged downstream of the light source 3 in emission direction can collect the light beams emitted by the LEDs 4 and can shape the same very effectively.

Figure 10:
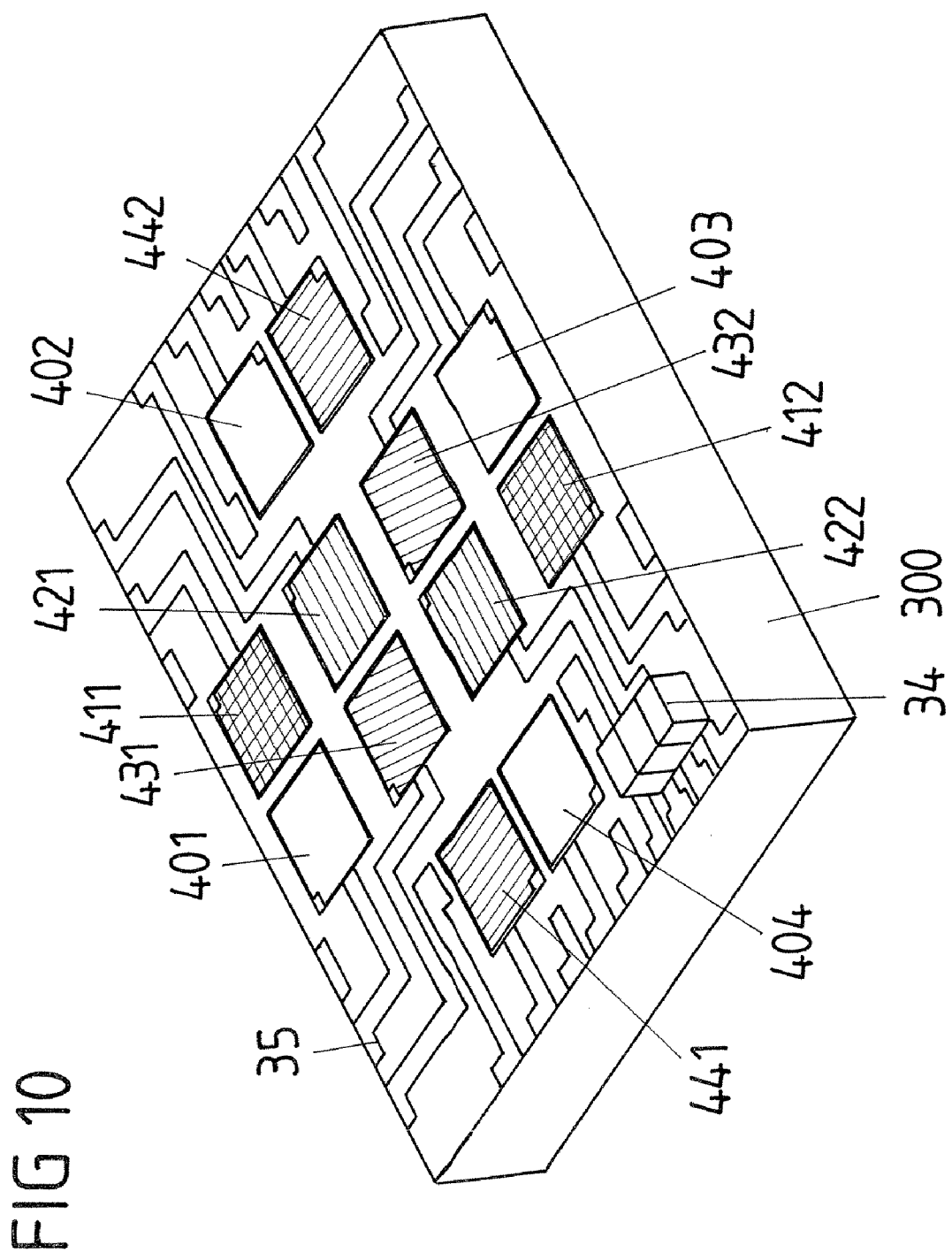
FIG. 10 shows a perspective representation of a further embodiment of a light source arranged on an aluminum nitride ceramic board with integrated temperature sensor.

The light source 3 shown in FIG. 10 in a schematic perspective view is composed of twelve LEDs 401-403, 411, 412, 421, 422, 431, 432 and 441, 442 and a temperature sensor 34, which are arranged on the metal core board 300 together with conductors 35, which are guided from the LEDs 401-403, 411, 412, 421, 422, 431, 432 and 441, 442 and from the temperature sensor 34 to the edges of the cuboid metal core board 300, where they are connected with the module electronic via a direct wire or bond connection. This configuration provides for the construction of a very small and hence inexpensive light source with high luminance.

Figure 11:
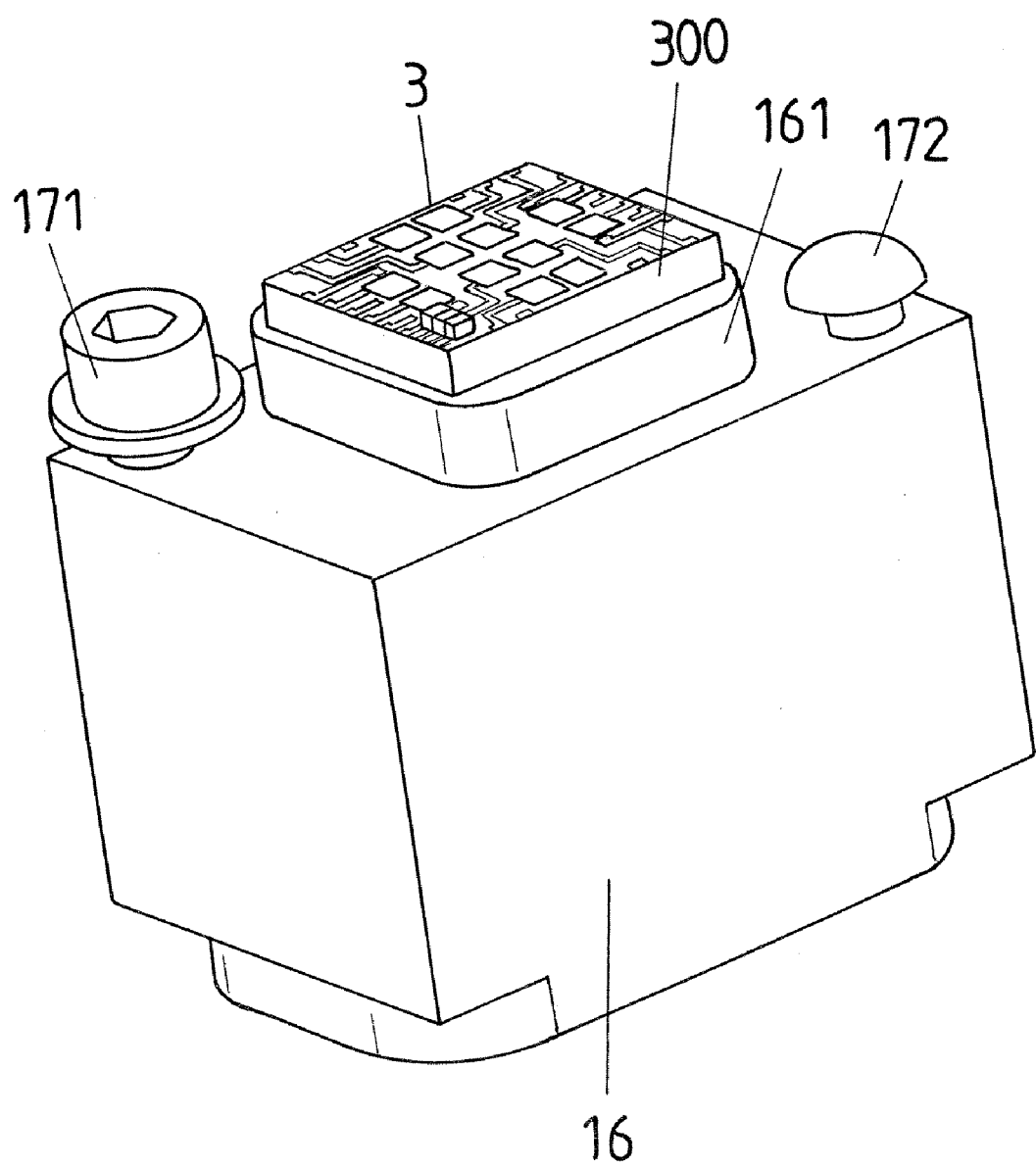
FIG. 11 shows a perspective representation of the light source of FIG. 10 arranged on a module heat sink with elevated base.
Figure 13:
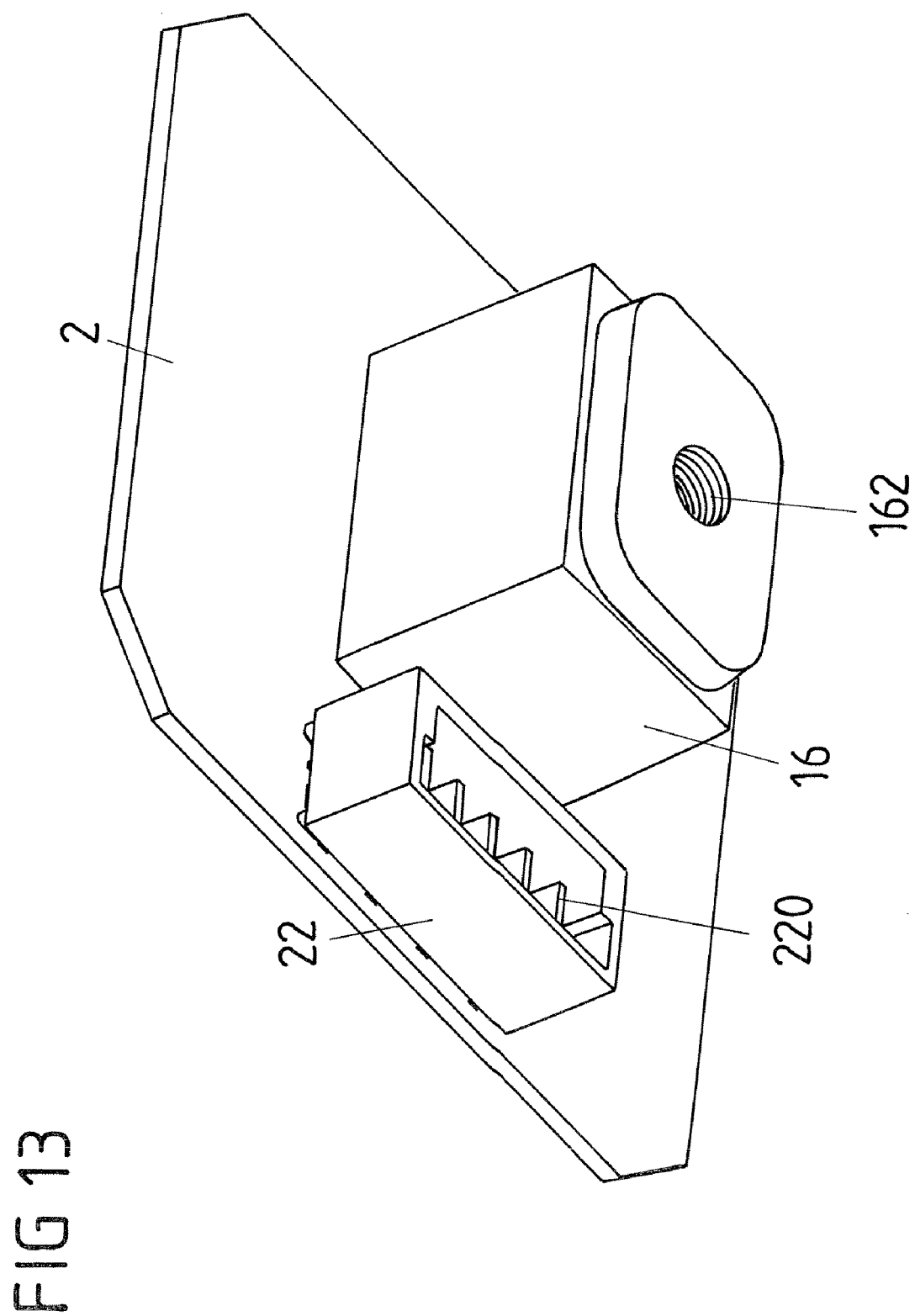
FIG. 13 shows a perspective view of the bottom surface of the lighting module of FIG. 12.

For optimum dissipation of the heat emitted by the light source 3 in operation of the lighting module, the metal core board 300 as shown in FIG. 11 is connected with the surface of a base 161 of a module heat sink 16, which has a parallelepiped or cube shape, consists of a material conducting heat very well, such as copper or aluminum, and as shown in FIG. 13 has a bore with a thread 162 on its bottom surface, via which a safe and simple mechanical connection of the entire lighting module with a lamphead housing or a cooling means can be effected by using standard fastening elements such as screws, pins and the like.

Via coolant conduits, the module heat sink 16 can be connected with a heat exchanger. Liquid cooling of the module heat sink 16 and hence of the lighting module is recommendable for example when a lighting equipment is arranged on a telescope below a studio ceiling and provides for an efficient cooling, since only those parts are cooled which generate heat. Another possibility consists in connecting the module heat sink 16 or the lighting equipment via coolant circuits with an external control and cooling device or using a camera light or small array configured as individual spot with a heat pipe and a fan-type heat sink.

The base 161 protruding beyond the surface of the module heat sink 16 has a surface which approximately corresponds to the surface of the metal core board 300. Laterally of the base 161 bores for receiving fastening elements such as screws 161 or grooved pins 172 are provided in the surface of the module heat sink 16, which provide for a safe connection with the module carrier 2 formed as circuit board, which according to FIGS. 12 and 13 includes a central recess 21 through which the base 161 of the module heat sink 16 is inserted, so that the surface of the light source 3 with the LEDs 4 arranged thereon is disposed at least at the same level, preferably however above the fastening elements 171, 172 and above the non-illustrated electronic components of the module electronic 20 arranged on the upper surface of the module carrier 2, so that the optical path of the LEDs 4 is not disturbed.

By connecting the module carrier 2 with the module heat sink 16 via the fastening elements 171, 172 it is ensured that the module carrier 2 is not subjected to a mechanical load and that a flat, space-saving construction is achieved by putting the module carrier 2 onto the base 161 of the module heat sink 16. Via the threaded bore 162 arranged at the bottom of the module heat sink 16 and a fastening element screwed to the threaded bore 162, the entire lighting module thus can be attached to a greater heat sink or to a lamphead housing, wherein it is thermally advantageous when the light source 3 is directly coupled to the module heat sink 16.

Figure 12:
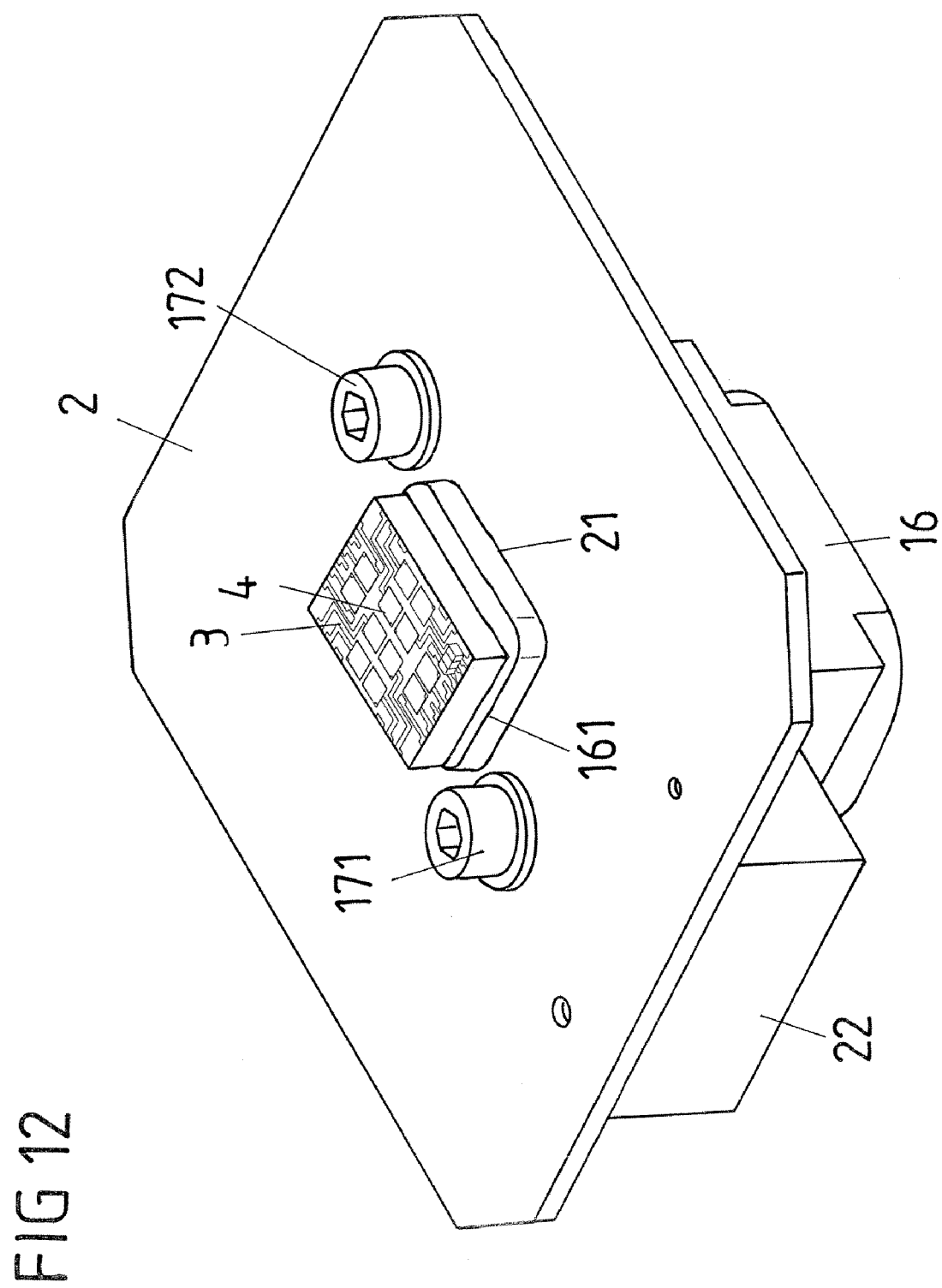
FIG. 12 shows a perspective representation of a lighting module with a module carrier formed as board with a recess into which a base of a module heat sink carrying the light source of FIG. 10 is inserted.
Figure 15:
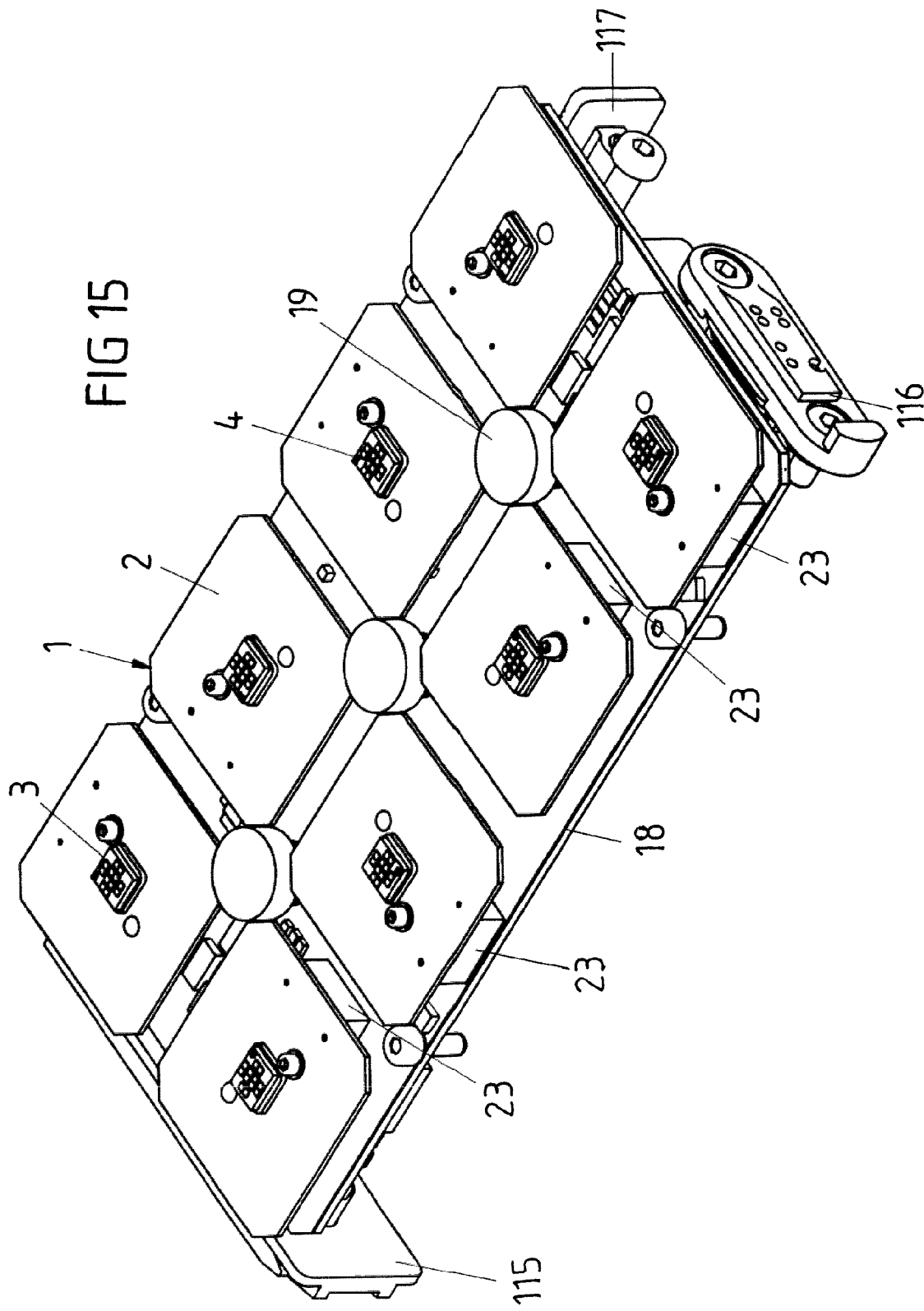
FIG. 15 shows an isometric view from above of the board of FIG. 14 equipped with eight lighting modules and electronic components of the LED panel.

According to FIG. 12, the connection of the module electronic with an external controller 10 shown in FIG. 15 is effected via a contact plug 22 which is arranged on the bottom surface of the module carrier 2 and according to FIG. 13 includes five contacts in the case of a voltage supply of the module electronic with two different supply voltages. A contact socket connectable with the contact plug 220 accordingly has five sockets which are connected with two voltage sources, a ground potential and with two contacts of a serial interface to the external controller.

The lighting module shown in FIGS. 10 to 13 provides for a very simple and space-saving flat arrangement of a plurality of similar lighting modules on the board of an LED panel (motherboard or backplane), which for example is connected with a lighting equipment such as a lamphead.

Figure 14:
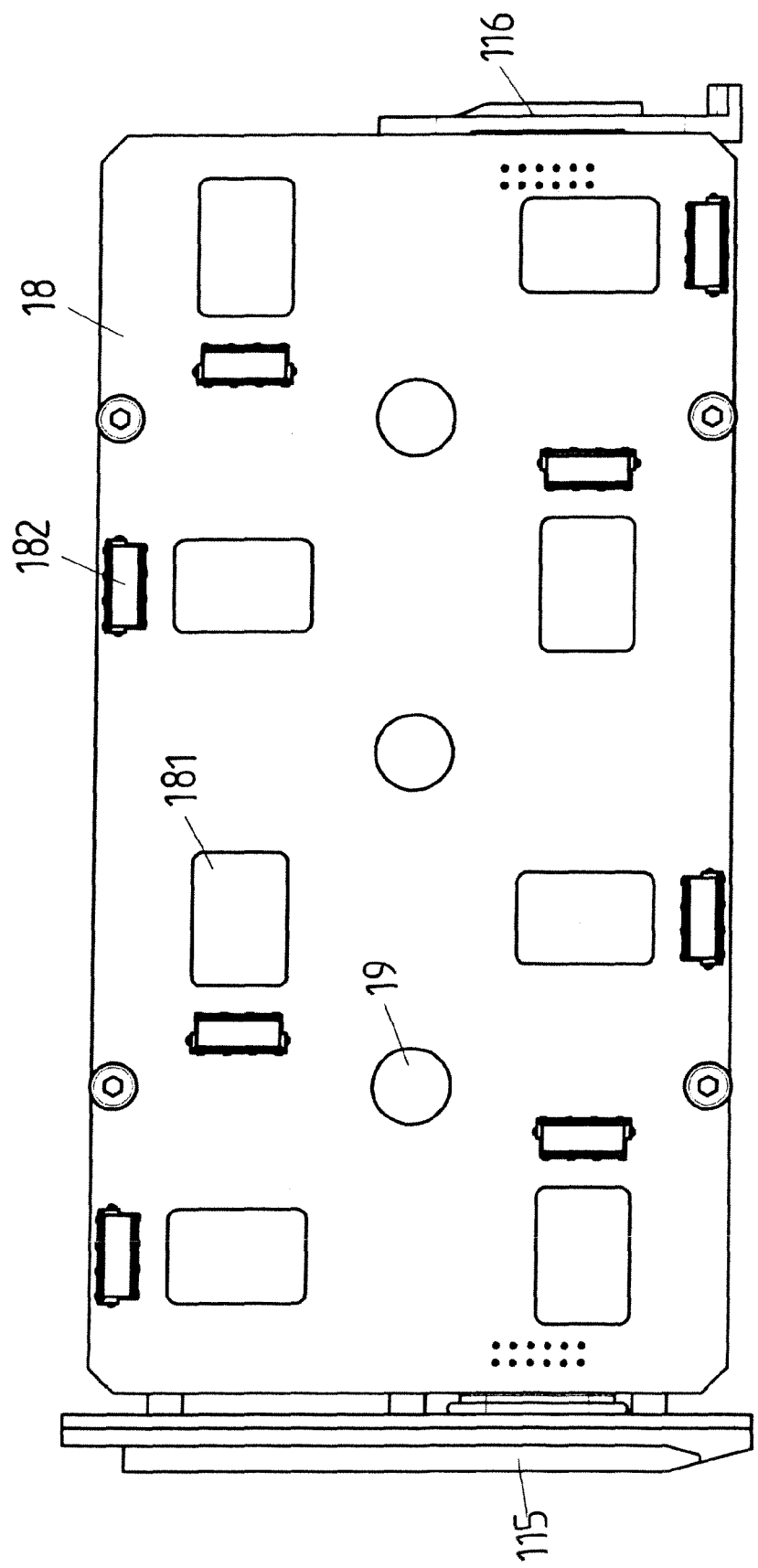
FIG. 14 shows a top view of a board of an LED panel for an LED lighting system without equipment with electronic components of the LED panel and without lighting modules.
Figure 16:
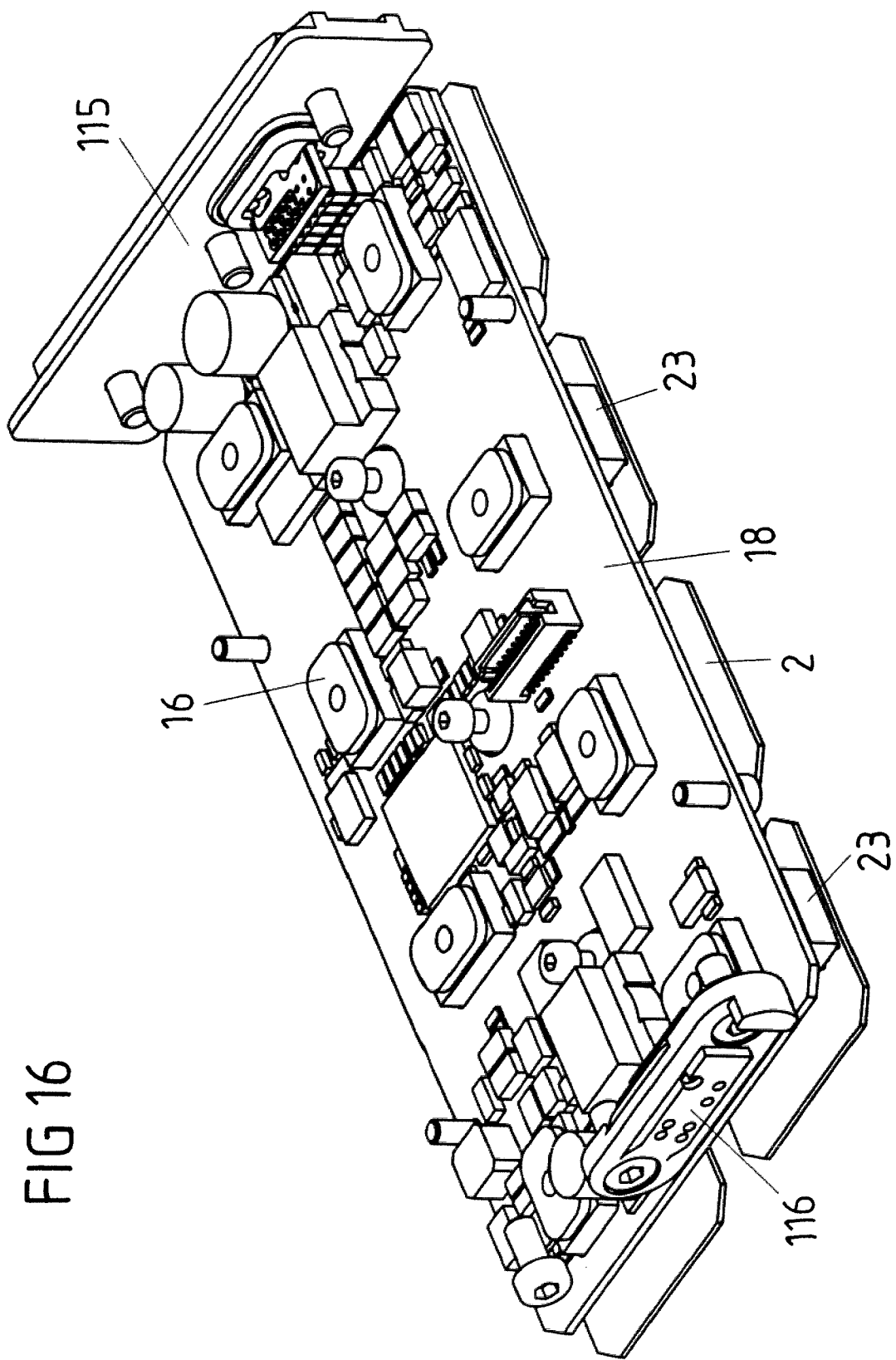
FIG. 16 shows a view of the board of the LED panel of FIG. 15 from below with equipment and eight lighting modules inserted into the recesses.

An embodiment for such board 18 configured as motherboard, which among other things accommodates the external controller 10 and further memory, control and interface elements of an LED panel for an LED lighting system, is shown in FIGS. 14 to 16.

FIG. 14 shows a top view of the board 18 of an LED panel, which among other things accommodates an external controller and further memory, control and interface elements. In the rectangular board 18 eight openings 181 for inserting the module heat sinks 25 of the lighting module 2 and eight sockets 182 for receiving the contact plugs 23 of the individual lighting modules 2 each with a different orientation of the openings 181 and sockets 182 are provided for the module heat sinks 25 and the contact plugs 23, respectively. For a better understanding, the electronic components of the memory and control elements arranged on both sides of the board 18 are omitted in the top view of FIG. 14. On its narrow sides, the rectangular board 18 includes input and output convectors 115, 116, which are aligned vertical to the plane of the board 18 and form inputs and outputs for an LED panel shown in FIG. 18. Spaced from each other, mounting magnets 19 for mounting an optical device (primary and secondary optics) are arranged centrally on the board 18.

In FIGS. 15 and 16, the arrangement of the lighting modules 1 with the module carrier 2, the light source 3 and the LEDs 4, of the module heat sinks 25 inserted into the openings 181 of the board 18 and of the contact plugs 23 inserted into the sockets 182 as well as the arrangement of the mounting magnets 19, the non-specified electronic components of the memory and control elements of the LED panel and a plurality of input and output connectors 115, 116, 117 is shown in an isometric view of the upper surface and lower surface of the board 18.

In general, the lighting module described with reference to FIGS. 1 to 13 offers the advantages of an adjustable, precise light source with a plurality of LEDs and an integrated microprocessor circuit, which provides for a very large color space and color temperature range of e.g. 2,000° K. to 25,000° K. and a very good color rendering with a color rendering index CRI>90 between 2,200° K. and 12,000° K. as well as a color rendering index CRI>95 between 3,200° K. and 6,500° K. with an LED output of up to 12 W. In addition, a light flux up to 300 lm can be achieved in the setting "white" at a junction temperature of 100° C.

The lighting module provides for up to six independent color channels with a standard equipment in the colors red, green, blue, white and amber and a very high luminance due to the circular arrangement of e.g. twelve LED chips with a diameter each of 5.6 mm.

The range of application of the lighting module can be expanded by attachment of optics, also with a narrow scattering angle, without the occurrence of color divergences. The modular design of the lighting unit provides for lining up a multitude of lighting modules with the same behavior and a combination of the control on an external controller with download function for the operating program and the parameters and an exchange of data via the serial interface.

The light mixture emitted by the light source 3 is treated further individually for each lighting module 1 or in an entirety of a plurality of lighting modules 1 combined to one lighting device. For example, from a number of N lighting modules 1 a total system can be formed for a lighting device configured as LED panel, lamphead, light chain or the like, wherein one of the lighting modules 1 constitutes a master module and contains the characteristic and calibration data of the lighting device, while the further lighting modules 1 constitute slave modules. In such arrangement, all lighting modules 1 of the total system communicate with an external control unit or controller. A combination of N lighting modules 1 to a total system will be explained below with reference to the LED lighting device shown in FIGS. 17 and 18.

Figure 17:
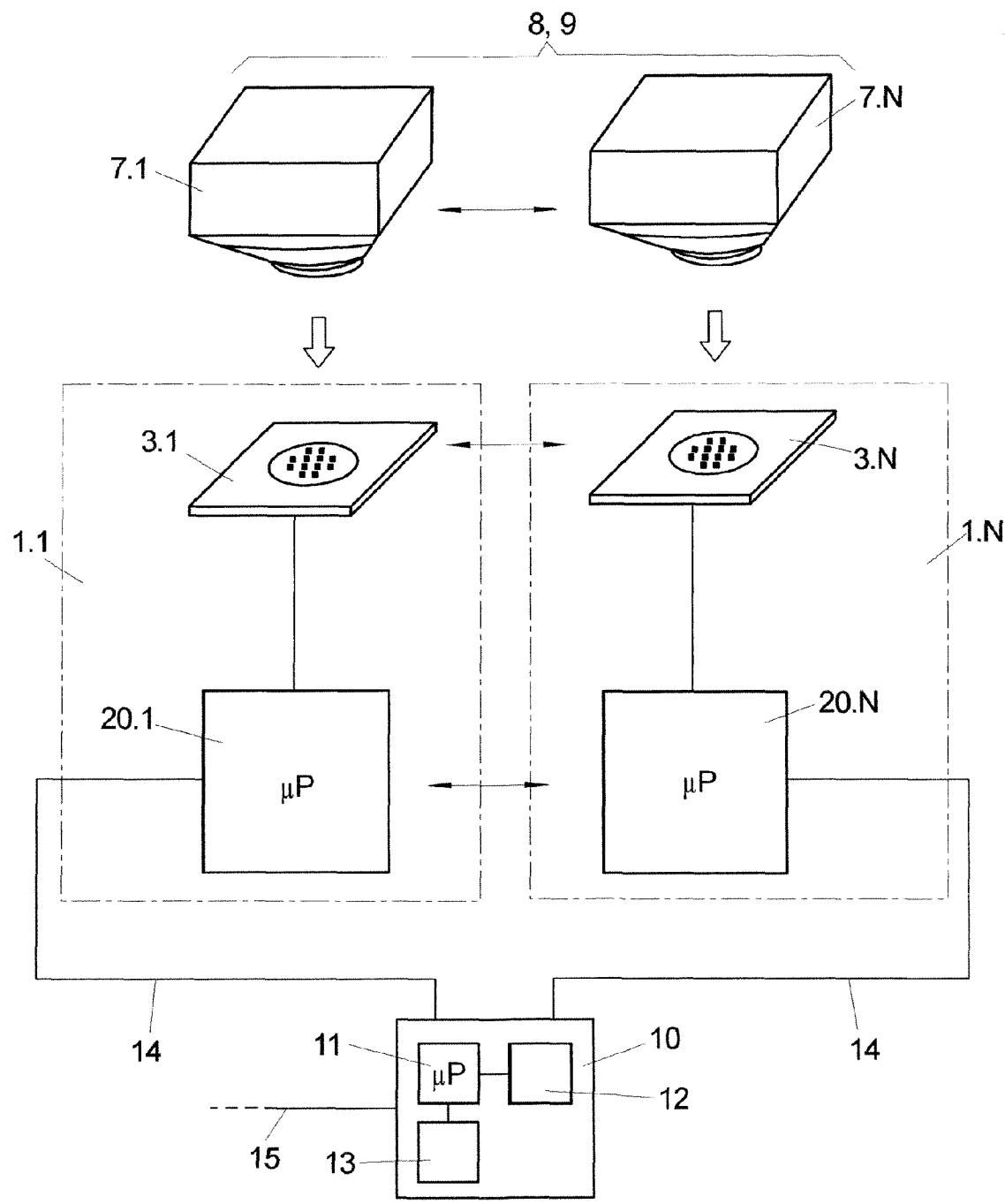
FIG. 17 shows a schematic representation of the connection of the module electronic of a plurality of lighting modules with an external controller.

FIG. 17 shows a schematic representation of the circuitry of an interconnection of N lighting modules 1.1 to 1.N to a lighting device which is controlled by an external controller 10.

Corresponding to the above description, the lighting modules 1.1 to 1.N each contain a light source 3.1 to 3.N, a module electronic 20.1 to 20.N and an optic, in the embodiment shown here a primary optic 7.1 to 7.N. Via a serial interface 14, the module electronics 20.1 to 20.N of the individual lighting modules 1.1 to 1.N are connected with the external controller 10 for the actuation and automatic control of the N lighting modules 1.1 to 1.N, which includes a plurality of analog and digital inputs and outputs and a microprocessor 11 with its own, non-volatile memory 12.

The external controller 10 receives data and control commands via a control line 15 and issues corresponding color control signals to the lighting modules 1.1 to 1.N. An automatic temperature compensation is performed by means of characteristic curves stored in the non-volatile memory 12, so that the color and the brightness of the lighting modules 1.1 to 1.N remains constant. For this purpose, the temperature values issued by the temperature sensors arranged on the light sources 3.1 to 3.N are read in and processed by the external controller 10. For monitoring and possibly for compensating long-term effects, an additional photosensor 13 can also be integrated in the external controller 10.

Figure 18:
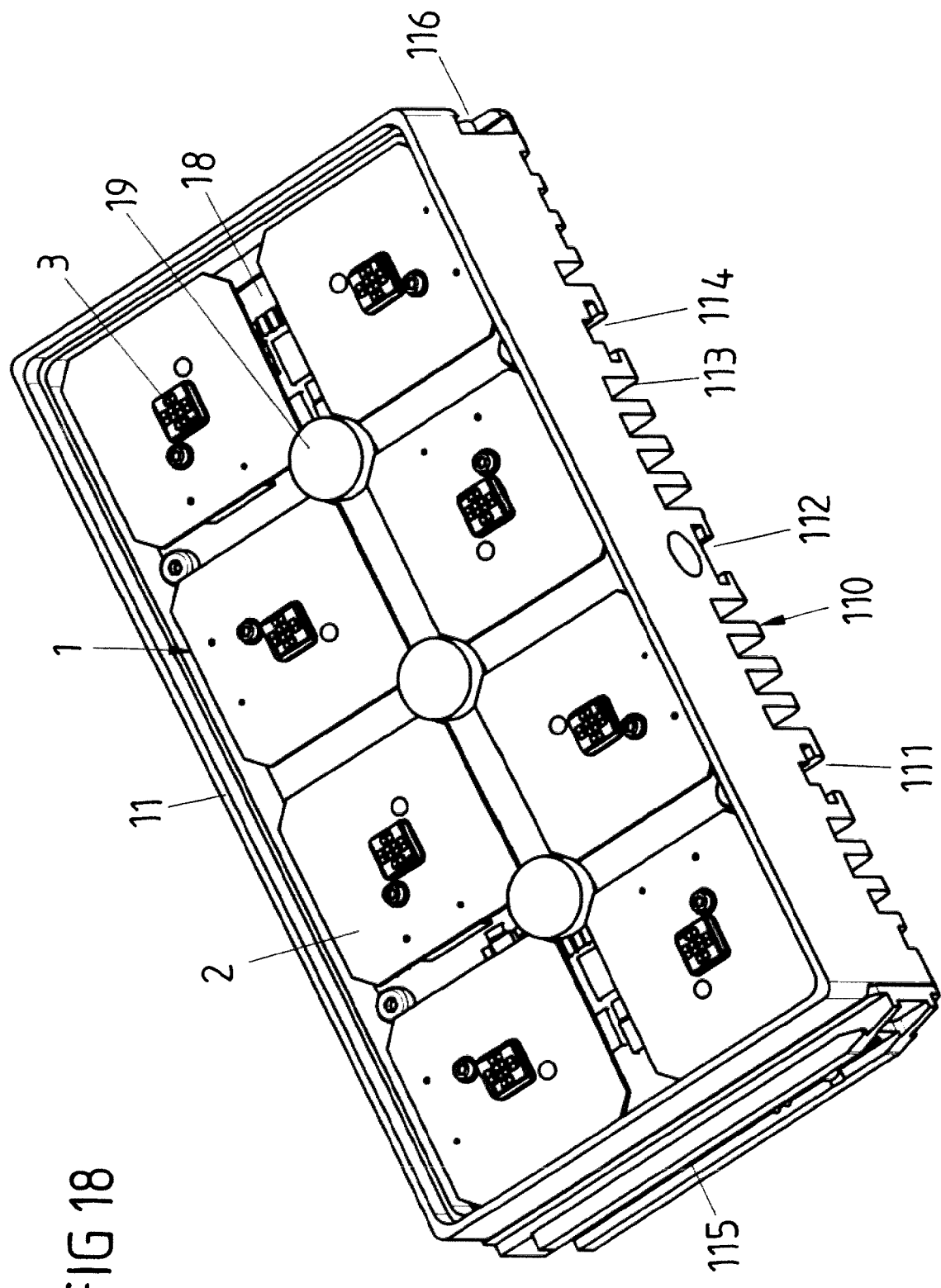
FIG. 18 shows an isometric view of an LED panel with eight lighting modules without optical device for a lighting system.

FIG. 18 shows an isometric view of an LED panel which includes a rectangular housing frame 11 with a closed bottom surface constituting a heat sink surface 110 with cooling fins 113, into which the board 18 accommodating the lighting modules 1 as shown in FIGS. 14 to 16 is inserted. On its narrow sides, the LED panel includes input connectors 115 and output connectors 116 for connection with a power supply and control means with an external controller and for connection with a decentralized control element associated to the respective LED panel and/or an accumulator for the autonomous energy supply of the LED panel.

In the board 18, eight identically formed lighting modules 1 are inserted and mechanically and electrically connected with the board 18. Between the lighting modules 1 arranged in two rows and eight columns, three mounting magnets 19 are arranged, which serve for attachment of an optical device for example in the form of a soft optic or spot optic to be mounted on the housing frame 11.

In the heat sink surface 110 forming the bottom surface of the housing frame 11, three mounts 111, 112, 114 are integrated, into which a connecting element can be inserted and positively be connected with the LED panel. As connecting element, there is in particular used a connecting pin connected or connectable with a stand, a rig or another carrier element. The mounts 111, 112, 114 are T-shaped in the manner of a slotted box section with and without additional groove, whereas the connecting pin has a corresponding counter-profile, which by plugging on the connecting pin from the side of the housing frame 11 can be inserted into the mounts 111, 112, 114 and positively engages in depressions.

Due to the autonomous formation of the module electronic and hence of the lighting modules, the lighting modules can be actuated individually, whereby among other things
- a dynamic change in color over time and over the luminous area from module to module and/or
- a dynamic change in brightness up to the complete switching on or off of certain regions of the luminous area is achieved.

The following effects can be achieved therewith:
- by switching on a partial region of the luminous area, the direction from which the light is radiated can be varied for example for a portrait lighting;
- the characteristic of the lighting device can steplessly be varied between "spotlight" and "softlight" by operating for example a few modules in the center of the lighting device with high power (spotlight) or many modules with low power (softlight). Thus, in the context of a total electrical and thermal output, many possibilities exist;
- color fringes can selectively be generated,
- in a secondary optic with small scattering angle, patterns can be projected onto a surface and be varied dynamically in terms of color and brightness.

To primary optics 7.1 to 7.N connected with the lighting modules 1.1 to 1.N movable parts can be connected as light couplings, which consist of a light guide or a mirror or prism system for light outcoupling. Alternatively or in addition, individual secondary optics associated to each primary optic 7.1 to 7.N or a secondary optic common to all primary optics 7.1 to 7.N can be provided for beam forming, which possibly is/are focusable by motor, pneumatically or hydraulically.

Depending on the intended use, various primary and/or secondary optics can be used, namely
- a secondary optic formed as whitebox, waveguide or full lightguide box with wide scattering angle, high efficiency and homogeneous luminous area;
- a projection optic with narrow scattering angle;
- a spot optic with homogeneous illumination, narrow half-peak angle and high efficiency, or
- a spot optic with homogeneous illumination, large half-peak angle and high efficiency.

A secondary optic for beam forming serves the variable expansion of the light emitted by the primary optics 7.1 to 7.N and the light sources 3.1 to 3.N, respectively, to greater or smaller half-peak angles, wherein the light beams emitted by the primary optics 7.1 to 7.N and the light sources 3.1 to 3.N, respectively, can be rendered narrow or wide as desired by a corresponding lens arrangement, so that focusing is individually adjustable.

Finally, optical accessories in the form of a tertiary optic for varying the radiation angle, for example by lens plates movable with respect to each other or a diaphragm device in the form of barn doors for lateral limitation of the light radiated by the lighting device, or in the form of iris diaphragms, scrims, gobos and the like, can be provided subsequent to the secondary optic.

Due to the modular design of the lighting device, various combinations of lighting modules are possible, which either are configured as basic lighting modules in conjunction with a primary optic, wherein a specified number of such basic lighting modules with primary optic are combined to form a lighting device which possibly is expanded with a light coupling, a secondary optic or with optical accessories. For example, a plurality of lighting modules can be combined to form lampheads or surface luminaires, which are mechanically and electrically coupled to each other via quick connectors, wherein the light-emitting surface of the lamphead or the surface luminaire can be designed as desired, in order to provide for example circular, square or elongated radiating surfaces.

Further configurations of the modular lighting device of the invention consist in that lighting modules lined up in a row have joints at certain points, so that either a compact panel with an arbitrary geometrical shape of the light-emitting surface is formed, which is formed circular, square, rectangular or as luminous strip, in which a plurality of lighting modules are connected in series in a row.

FIG. 19 shows an overview diagram of the individual function elements of a modular lighting system with an individual LED panel 50, in which eight lighting modules 1 with a light source composed of LEDs emitting light of different wavelengths and hence colors are arranged. The LED panel 50 forms a luminous body, which in addition can be expanded by a soft optic 61 or spot optic 52 to be mounted on the upper surface of the LED panel 50 for an additional light mixture of the LEDs emitting light of different wavelengths and hence colors and for a desired beam forming. The LED panels 50 include lateral electromechanical connectors, via which a plurality of LED panels 50 can electrically and mechanically be connected to form a row of LED panels. Via additional cross connectors 57, a plurality of LED panel rows can be joined to form an LED panel group 50' with a matrix-like structure.

To an individual LED panel 50 or to an LED panel group 50' an individual control element 55 can be connected for the decentralized actuation of the respective LED panel 50 or LED panel group 50' and provides for an individual actuation or adjustment of light parameters of the lighting modules of the respective LED panel 50 or LED panel group 50'. After entering data or setting the parameters, the control element 55 can again be separated from the LED panel 50.

For the autonomous power supply, an individual LED panel 50 or an LED panel group 50' electrically and mechanically connected with the LED panel 50 can be connected with an accumulator 58, which preferably can likewise be connected to the LED panel 50 directly or via a connecting element.

A central power control unit 53, 54 serves for supplying power to an LED panel 50 or an LED panel group 50' and for entering nominal values for actuating the lighting modules 1 of the individual LED panels 50 and consists of a power supply and docking station 53 and a controller 54, which can be connected to the power supply and docking station 53 or can be operated via a radio or line connection separate from the power supply and docking station 53. The power supply and docking station 53 includes a plurality of sockets, which via connecting cables 56 effect an electrical connection for the power supply and actuation of the LED panel 50 or LED panel group 50'.

The invention claimed is:

1. A lighting device comprising a plurality of lighting modules which include a module carrier on which a light source with a plurality of controllable light-emitting diodes (LEDs) emitting light of different wavelengths and arranged on a board, a temperature sensor and a module electronic are arranged, wherein
   said module electronic including a digital circuit with a microcontroller for local and autonomous signal processing, which actuates the LEDs in dependence on temperature wherein a brightness, color and chrominance of the light mixture composed of the LEDs emitting light of different wavelengths is constant,
   said lighting modules being connected with other lighting modules or an external controller via a digital interface for transmitting a board temperature of the respective lighting module detected by means of the temperature sensor, wherein
   a central master module or the external controller actuates the lighting modules such that a uniform brightness is obtained over a radiating surface.

2. The lighting device of claim 1, wherein said external controller performs a periodic scan of all board temperatures of the lighting modules and issues a signal representing the highest temperature determined for all lighting modules, which after a synchronization command performs a brightness adaptation on the basis of the signal representing the highest temperature determined.

3. The lighting device of claim 1, wherein said lighting modules are connected to the external controller via a digital, serial interface for the transmission of data for actuating color channels by means of color control signals issued by the external controller to the lighting modules for the calibration and retrieval of status information of the lighting modules and for the download of the operating program.

4. The lighting device of claim 1, wherein said lighting modules and a superordinate control and regulating means are programmable such that
   in an operating mode optimized in terms of color rendering white light for lighting purposes, or
   in an operating mode optimized in terms of brightness with luminous intensity for the purpose of studio, theatre and effect lighting is radiated.

5. The lighting device of claim 1, wherein a plurality of lighting modules and said external controller are arranged on an LED panel or motherboard, said plurality of lighting modules being inserted into openings of the motherboard.

6. The lighting device of claim 1, wherein said board of the light source is arranged on a base of a module heat sink which is elevated with respect to a surface of the module heat sink, the surface of the module heat sink accommodating the base including fastening elements for connecting the module heat sink with the module carrier.

7. The lighting device of claim 1, wherein said module carrier is plate-shaped and includes a recess for inserting the board formed as a circuit board or a base of the module heat sink, said module carrier including mounting holes for the board or the module heat sink as well as connecting elements for connecting the module carrier with the motherboard.

8. The lighting device of claim 1, wherein said module carrier has a contour for a substantially uninterrupted line-up of a multitude of similarly formed lighting modules for a light-emitting surface of a lighting equipment.

9. The lighting device of claim 1, wherein said module electronic is connected with at least one brightness and/or color sensor arranged on the module carrier.

10. The lighting device of claim 1, wherein a photosensor is integrated in said external controller for monitoring or for compensating long-term effects.

11. The lighting device of claim 1, wherein said module electronic issues pulse-width-modulated control signals for actuating the LEDs of the light source and on each color channel processes signals or values with respect to the brightness of the white or colored light emitted by the LEDs by specifying a desired current value ($I_{DES}$) from a serial interface, the basic brightness due to an uncorrected brightness of a color channel under nominal conditions, the temperature by the temperature signal issued by the temperature sensor of the light source, a characteristic curve control for the temperature compensation of the brightness, and the highest temperature in the lighting device or the lighting module for compensating convection-related differences in brightness.

12. The lighting device of claim 1, wherein said module electronic actuates the LEDs emitting light of different wavelengths either individually or in groups of LEDs each emitting light of the same wavelength.

13. The lighting device of claim 1, wherein said module electronic is connected with the external controller via a serial interface and with a voltage source via at least one power supply line.

14. The lighting device of claim 1, wherein said module electronic includes a circuit for the power supply, power limitation or power control of the LEDs emitting light of different wavelengths.

15. The lighting device of claim 1, wherein said module electronic contains a plurality of similarly constructed drive circuits for actuating individual LEDs or for simultaneously actuating a plurality of LEDs each emitting light of the same wavelength, said drive circuits each being connected to an output of the microcontroller emitting pulse-width-modulated control signals and said drive circuits each being supplied with a supply voltage, a number of n different supply voltages being associated to a drive circuit or a plurality of drive circuits.

16. The lighting device of claim 15, wherein said drive circuits include a temperature-compensated constant-current source which is connected to a supply voltage associated to the drive circuit and actuates an electronic switch connected in series to the LEDs fed by the respective drive circuit such that the LEDs are fed with a constant current.

17. The lighting device of claim 1, wherein said LEDs constitute LED chips which in a chip-on-board technology are electrically contacted with the conductors of the board, by bonding, flip-chip contacting or conductive gluing.

18. The lighting device of claim 1, wherein an optic is coupled to said lighting module or to a plurality of lighting modules combined to a group of lighting modules.

19. The lighting device of claim 18, wherein a secondary optic includes two microlens plates adjustable with respect to each other for expanding or concentrating the light beams emitted by the LEDs.

20. The lighting device of claim 18, wherein said secondary optic is adjustable by motor, pneumatically or hydraulically for focusing the light beams emitted by the light source and for varying a half-peak angle in a direction of an optical axis of the lighting module.

21. The lighting device of claim 1, wherein said light source or a primary optic for collecting the light beams emitted by the LEDs or a secondary optic is connected with a means for coupling out light, with a light guide or with a mirror or prism system.

* * * * *